US008961853B2

(12) United States Patent
Mirkin et al.

(10) Patent No.: US 8,961,853 B2
(45) Date of Patent: Feb. 24, 2015

(54) SILICON PEN NANOLITHOGRAPHY

(75) Inventors: Chad A. Mirkin, Wilmette, IL (US);
Wooyoung Shim, Skokie, IL (US);
Adam B. Braunschweig, New York, NY (US); Xing Liao, Evanston, IL (US);
Jinan Chai, Spartanburg, SC (US); Jong Kuk Lim, Gwangju (KR); Gengfeng Zheng, Ambler, PA (US); Zijian Zheng, Hong Kong (CN)

(73) Assignee: Northwestern University, Evanston, IL (US)

( * ) Notice: Subject to any disclaimer, the term of this patent is extended or adjusted under 35 U.S.C. 154(b) by 348 days.

(21) Appl. No.: 13/375,361

(22) PCT Filed: Jun. 4, 2010

(86) PCT No.: PCT/US2010/037428
§ 371 (c)(1),
(2), (4) Date: Feb. 17, 2012

(87) PCT Pub. No.: WO2010/141836
PCT Pub. Date: Dec. 9, 2010

(65) Prior Publication Data
US 2012/0167262 A1 Jun. 28, 2012

Related U.S. Application Data

(60) Provisional application No. 61/350,349, filed on Jun. 1, 2010, provisional application No. 61/184,578, filed on Jun. 5, 2009.

(51) Int. Cl.
B29C 59/02 (2006.01)
G03F 7/00 (2006.01)
(Continued)

(52) U.S. Cl.
CPC .......... G03F 7/0002 (2013.01); B81C 1/00111 (2013.01); B81C 1/0046 (2013.01);
(Continued)

(58) Field of Classification Search
USPC ...................... 425/385; 850/59, 60; 977/732; 346/140.1; 118/667; 101/32; 216/16; 264/293
See application file for complete search history.

(56) References Cited

U.S. PATENT DOCUMENTS 5,472,881 A 12/1995 Beebe et al.
5,776,748 A 7/1998 Singhvi et al.
(Continued)

FOREIGN PATENT DOCUMENTS

WO WO-95/26037 A1 9/1995
WO WO-99/48682 A1 9/1999

OTHER PUBLICATIONS

Jacobs et al, Submicrometer Patterning of Charge in Thin-Film Electrets, Science, vol. 291, Mar. 2, 2001, pp. 1763-1766.*
(Continued)

Primary Examiner — Robert B Davis
(74) Attorney, Agent, or Firm — Marshall, Gerstein & Borun LLP

(57) ABSTRACT

Disclosed are methods of lithography using a tip array having a plurality of pens attached to a backing layer, where the tips can comprise a metal, metalloid, and/or semi-conducting material, and the backing layer can comprise an elastomeric polymer. The tip array can be used to perform a lithography process in which the tips are coated with an ink (e.g., a patterning composition) that is deposited onto a substrate upon contact of the tip with the substrate surface. The tips can be easily leveled onto a substrate and the leveling can be monitored optically by a change in light reflection of the backing layer and/or near the vicinity of the tips upon contact of the tip to the substrate surface.

23 Claims, 8 Drawing Sheets

(51) Int. Cl.
  *B81C 1/00* (2006.01)
  *B82Y 10/00* (2011.01)
  *B82Y 40/00* (2011.01)

(52) U.S. Cl.
  CPC ... *B81B2203/0361* (2013.01); *B81B 2207/056* (2013.01); *B81C 2201/0154* (2013.01); *B81C 2201/0185* (2013.01); *B82Y 10/00* (2013.01); *B82Y 40/00* (2013.01); *Y10S 977/732* (2013.01)
  USPC ............... 264/293; 101/32; 118/667; 216/16; 346/140.1; 425/385; 850/59; 850/60; 977/732

(56) References Cited

U.S. PATENT DOCUMENTS

| | | | |
|---|---|---|---|
| 5,846,909 | A | 12/1998 | McDevitt et al. |
| 5,908,692 | A | 6/1999 | Hamers et al. |
| 5,942,397 | A | 8/1999 | Tarlov et al. |
| 6,500,549 | B1 | 12/2002 | Deppisch et al. |
| 6,596,346 | B2 | 7/2003 | Bernard et al. |
| 7,281,419 | B2 | 10/2007 | Wang et al. |
| 7,491,422 | B2 | 2/2009 | Zhang et al. |
| 2004/0227075 | A1 | 11/2004 | Liu et al. |
| 2009/0325816 | A1* | 12/2009 | Mirkin et al. ............... 506/15 |
| 2011/0132220 | A1* | 6/2011 | Mirkin et al. ............... 101/483 |
| 2011/0305996 | A1* | 12/2011 | Mirkin et al. ............... 430/324 |
| 2012/0097058 | A1* | 4/2012 | Mirkin et al. ............... 101/483 |
| 2012/0128882 | A1* | 5/2012 | Mirkin et al. ............... 427/256 |
| 2012/0297509 | A1* | 11/2012 | Mirkin et al. ............... 850/60 |
| 2013/0302464 | A1* | 11/2013 | Zheng et al. ............... 425/385 |

OTHER PUBLICATIONS

Allara et al., Spontaneously organized molecular assemblies. 1. Formation, dynamics and physical properties of n-Alkanoic acids adsorbed from solution on an oxidized aluminum surface, Langmuir, 1: 45 (1985).
Allara et al., The study of the gas-solid interaction of acetic acid with a cuprous oxide surface using reflection-absorption spectroscopy, J. Colloid Interface Sci., 49: 410-21 (1974).
Anwander et al., Surface characterization and functionalization of MCM-41 silicas via silazane silylation, J. Phys. Chem. B, 104:3532-44 (2000).
Bain et al., A new class of self-assembled monolayers: organic thiols on gallium arsenide, Adv. Mater., 4:591-4 (1992).
Bansal et al., Electrochemical properties of (111)-oriented n-Si surfaces derivatized with covalently-attached alkyl chains, J. Phys. Chem. B, 102:1067-70 (1998).
Bansal et al., Stabilization of Si photoanodes in aqueous electrolytes through surface alkylation, J. Phys. Chem. B., 102:4058-60 (1998).
Bernard et al., Printing patterns of proteins, Langmuir, 14:2225-9 (1998).
Bishop et al., Self-assembled monolayers: recent developments and applications, Curr. Opin. Colloid & Interface Sci., 1(1):127-36 (1996).
Brazdil et al. Resonance raman spectra of adsorbed species at solid-gas interfaces. 2. Y-Nitrosodimethylaniline and Y-Dimethylaminoazobenzene adsorbed on semiconductor oxide surfaces, J. Phys. Chem., 85, 1005-14 (1981).
Burwell Modified silica gels as adsorbents and catalysts, Chem. Technol., 4, 370-7 (1974).
Calvert, Lithographic patterning of self-assembled films, J. Vac. Sci. Technol. B, 11:2155 (1993).
Chang et al., Structures of self-assembled monolayers of aromatic-derivatized thiols on evaporated gold and silver surfaces: implication on packing mechanism, J. Am. Chem. Soc., 116, 6792-805 (1994).
Chen et al., Do alkanethiols adsorb onto the surfaces of Ti—Ba—Ca—Cu—O based high-temperature superconductors? The critical role of H2O content on the adsorption process, Langmuir, 12:2622-4 (1996).

Chen et al., Surveying the Surface Coordination Chemistry of a Superconductor: Spontaneous Adsorption of Monolayer Films of Redox-Active "Ligands" on YBa2Cu3O7-.delta, J. Am. Chem. Soc., 117(23): 6374-5 (1995).
Chen et al., Synthesis and characterization of carboxylate-modified gold nanoparticle powders dispersible in water, Langmuir, 15:1075-82 (1999).
Chidsey, Book of Abstracts, 214th ACS National Meeting, I&EC-027 (1997).
Despont et al., Wafer-scale microdevice transfer/interconnect: its application in an AFM-based data-storage system, J. Microelectromechanical Systems, 13:895-901 (2004).
Donzel et al., Hydrophilic poly(dimethylsiloxane) stamps for microcontact printing, Adv. Mater., 13(15): 1164-7 (2001).
Dubois et al., Synthesis, structure, and properties of model organic surfaces, Ann. Rev. Phys. Chem., 43:437-63 (1992).
Ellison et al., Adsorption of phenyl isothiocyanate on Si(001): A 1,2-dipolar surface addition reaction, J. Phys. Chem. B, 103:6243-51 (1999).
Ellison et al., Cycloaddition chemistry on silicon(001) surfaces: The adsorption of azo-tert-butane, J. Phys. Chem. B, 102:8510-8 (1998).
Eltekova et al., Adsorption of aromatic compounds from solutions on titanium dioxide and silica, Langmuir, 3:951-7 (1987).
Fenter et al., Structure of $CH_3(CH_2)_{17}SH$ self-assembled on the Ag(111) surface: An incommensurate monolayer, Langmuir, 7:2013-6 (1991).
Grabar et al., Preparation and characterization of Au colloid monolayers, Anal Chem, 67 : 735-43 (1995).
Gu et al., Electron tunneling at the semiconductor-insulator-electrolyte interface. Photocurrent studies of the n-InP-alkanethiol-ferrocyanide system, J. Phys. Chem. B, 102:9015-28 (1998).
Gui et al., Adsorption and surface structural chemistry of thiophenol, benzyl mercaptan, and alkyl mercaptans. Comparative studies at Ag(111) and Pt(111) electrodes by means of auger spectroscopy, electron energy loss spectroscopy, low-energy election diffraction, and electrochemistry, Langmuir, 7, 955-63 (1991).
Hamers et al., Formation of ordered, anisotropic organic monolayers on the Si(001) surface, J. Phys. Chem. B, 101:1489-92 (1997).
He et al., Preparation of hydrophilic poly(dimethylsiloxane) stamps by plasma-induced grafting, Langmuir, 19(17):6982-6 (2003).
Henderson et al., Self-assembled monolayers of ithiols, diisocyanides, and isocyanothiols on gold: "chemically sticky" surfaces for covalent attachment of metal clusters and studies of interfacial electron transfer, Inorg. Chim. Acta, 242:115-24 (1996).
Hickman et al., Combining spontaneous molecular assembly with microfabrication to pattern surfaces: selective binding of isonitriles to platinum microwires and characterization by electrochemistry and surface spectroscopy, J. Am. Chem. Soc., 111: 7271-7272 (1989).
Hickman et al., Toward orthogonal self-assembly of redox active molecules on Pt and Au: selective reaction of disulfide with Au and isocyanide with Pt, Langmuir, 8, 357-9 (1992).
Hong et al., A micromachined elastomeric tip array for contact printing with variable dot size and density, J. Micromech. Microeng., 18:015003 (6 pp.) (2008).
Hovis et al., Cycloaddition chemistry and formation of ordered organic monolayers on silicon(001) surfaces, Surf. Sci., 402-404:1-7 (1998).
Hovis et al., Cycloaddition chemistry of 1,3-dienes on the silicon(001) surface: competition between [4+2] and [2+2] reactions, J. Phys. Chem. B, 102:6873-9 (1998).
Hovis et al., Structure and bonding of ordered organic monolayers of 1,5-cyclooctadiene on the silicon(001) surface, J. Phys. Chem. B, 101:9581-5 (1997).
Hubbard, Electrochemistry of well-defined surfaces, Acc. Chem. Res., 13:177-84 (1980).
Huc et al., Self-assembled mono- and multilayers on gold from 1,4-diisocyanobenzene and ruthenium phthalocyanine, J. Phys. Chem. B, 103: 10489-95 (1999).
Huo et al., Polymer pen lithography, Science, 321(5896): 1658-60 (2008).
Iler, The Chemistry of Silica, Chapter 6, New York: Wiley (1979).
International Preliminayr Report on Patentability, International Application No. PCT/US2010/037428 (Dec. 6, 2011).

(56) References Cited

OTHER PUBLICATIONS

International Search Report and Written Opinion, International Application No. PCT/US2010/037428, mailing date Jan. 5, 2011.
James et al., Patterned protein layers on solid substrates by thin stamp microcontact printing, Langmuir, 14, 741-4 (1998).
Laibinis et al., f-Terminated alkanethiolate monolayers on surfaces of copper, silver, and gold have similar wettabilities, J. Am. Chem. Soc., 114, 1990-5 (1992).
Laibinis et al., Comparisons of self-assembled monolayers on silver and gold: mixed monolayers derived from $HS(CH_2)_{21}X$ and $HS(CH_2)_{10}Y$ (X, Y=$CH_3$, $CH_2OH$) have similar properties, Langmuir, 7:3167-73 (1991).
Lee et al., Adsorption of ordered zirconium phosphonate multilayer films on silicon and gold surfaces, J. Phys. Chem., 92 : 2597-601 (1988).
Li et al., Self-assembly of n-alkanethiolate monolayers on silver nanostructures: determination of the apparent thickness of the monolayer by scanning tunneling microscopy, J. Phys. Chem., 98, 11751-5 (1994).
Li et al., Technical Report No. 2: Self assembly of n-Alkanethiolate monolayers on silver nano-structures: determination of the apparent thickness of the monolayer by scanning tunneling microscopy, University of California Irvine (Jul. 12, 1994).
Liu et al., Nanofabrication of self-assembled monolayers using scanning probe lithography, Acc. Chem. Res., 33(7):457-66 (2000).
Lo et al., Polypyrrole growth on $YBa_2Cu_3O_7$-L modified with a self-assembled monolayer of N-(3-aminopropyl)pyrrole: hardwiring the "electroactive hot spots" on a superconductor electrode, J. Am. Chem. Soc., 118:11295-6 (1996).
Lunt et al., Chemical studies of the passivation of GaAs surface recombination using sulfides and thiols, J. Appl. Phys., 70:7449-67 (1991).
Lunt et al., Passivation of GaAs surface recombination with organic thiols, J. Vacuum Sci. Technol. B, 9:2333-6 (1991).
Magallon et al., Book of Abstracts, 215th ACS National Meeting, COLL-048 (1998).
Maoz et al., Nanoelectrochemical patterning of monolayer surfaces: toward spatially defined self-assembly of nanostructures, Adv. Mater., 11:55-61 (1999).
Maoz et al., Penetration-controlled reactions in organized monolayer assemblies. 1. Aqueous permanganate interaction with monolayer and multilayer films of long-chain surfactants, Langmuir, 3:1034-44 (1987).
Maoz et al., Penetration-controlled reactions in organized monolayers assemblies. 2. Aqueous permanganate interaction with self-assembling monolayers of long-chain surfactants, Langmuir, 3:1045-51 (1987).
Martin et al., Direct protein microarray fabrication using a hydrogel "stamper", Langmuir, 14(15):3971-5 (1998).
Matteucci et al., Synthesis of deoxyoligonucleotides on a polymer support, J Am Chem Soc, 103:3185-91 (1981).
Mayya et al., A study of the partitioning of colloidal particles based on their size during electrostatic immobilization at the air-water interface using fatty amine monolayers, J. Phys. Chem. B, 101, 9790-3 (1997).
Menzel et al., Surface-confined nanoparticles as substrates for photopolymerizable self-assembled monolayers, Adv. Mater., 11:131-4 (1999).
Meyer et al., Evidence for adduct formation at the semiconductor-gas interface. Photoluminescent properties of cadmium selenide in the presence of amines, J. Am. Chem. Soc., 110: 4914-18 (1988).
Minne et al., Centimeter scale atomic force microscope imaging and lithography, Appl. Phys. Lett., 73(12):1742-4 (1998).
Minne et al., Independent parallel lithography using the atomic force microscope, J. Vac. Sci. Technol. B, 14(4):2456-61 (1996).
Mirkin et al., Controlling the surface properties of high temperature superconductors, Adv. Mater., 9:167-73 (1997).
Mucic et al., Synthesis and characterization of DNA with ferrocenyl groups attached to their 5-termini: electrochemical characterization of a redox-active nucleotide monolayer, Chem Commun, 555-557 (1996).
Nakagawa et al., GaAs interfaces with octadecyl thiol self-assembled monolayer: structural and electrical properties, Japan J. Appl. Phys. Part I, 30:3759-62 (1991).
Nuzzo et al., Spontaneously organized molecular assemblies. 3. Preparation and properties of solution adsorbed monolayers of organic disulfides on gold surfaces, J Am Chem Soc, 109:2358-2368 (1987).
Ohno et al., Nanostructural formation of self-assembled monolayer films on cleaved AlGaAs/GaAs heterojuctions, Mol. Cryst. Liq. Cryst., 295:189-92 (1997).
Patil et al., Surface derivatization of colloidal silver particles using interdigitized bilayers: a novel strategy for electrostatic immobilization of colloidal particles in thermally evaporated fatty acid/fatty amine films, Langmuir, 14, 2707-11 (1998).
Pereira et al., Modification of surface properties of alumina by plasma treatment, J. Mater. Chem., 10, 259-61 (2000).
Piner et al., 'Dip-Pen' nanolithography, Science, 283:661-3 (1999).
Porter et al., Gold and silver nanoparticles functionalized by the adsorption of dialkyl disulfides, Langmuir, 14, 7378-86 (1998).
Reuter et al., Effects of gallium passivation on scanning tunneling microscope excited luminescence, MRS Proceedings, 380:119 (1995).
Salaita et al., Massively parallel dip-pen nanolithography with 55 000-pen two-dimensional arrays, Angew Chem Int Ed Engl., 45:7220-3 (2006).
Sangiorgi et al., Adsorption of 1-decylamine on copper, Gazz. Chim. Ital., 111:99-102 (1981).
Sastry et al., Langmuir-blodgett films of carboxylic acid derivatized silver colloidal particles: role of subphase pH on degree of cluster incorporation, J. Phys. Chem. B, 101:4954-8 (1997).
Sheen et al., A new class of organized self-assembled monolayers: Alkane thiols on GaAs(100), J. Am. Chem. Soc., 114:1514-5 (1992).
Slavov et al., Mechanism of silation of silica with hexamethyldisilazane, J. Phys. Chem. B, 104:983-9 (2000).
Solomun et al., On the promoting effect of alkali metals on the adsorption of nitriles on the gold(100) surface, Ber. Bunsenges. Phys. Chem., 95:95-8 (1991).
Solomun et al., The interaction of nitriles with a potassium-promoted gold(100) surface, J. Phys. Chem., 95:10041-9 (1991).
Son et al., Adsorption of 4-methoxybenzyl cyanide on silver and gold surfaces investigated by fourier transform infrared spectroscopy, J. Phys. Chem., 98:8488-93 (1994).
Song, Quenching of porous silicon photoluminescence by aromatic molecules, and surface derivatization of porous silicon with dimethyl sulfoxide, aryllithium, or alkyllithium reagents, Doctoral Dissertation, University of California at San Diego (1998).
Soriaga et al., Determination of the orientation of aromatic molecules adsorbed on platinum electrodes. The effect of solute concentration, J Am Chem Soc, 104:3937-45 (1982).
Steiner et al., Adsorption of alkanenitriles and alkanedinitriles on gold and copper, Langmuir, 8, 2771-7 (1992).
Steiner et al., Adsorption of $NPh_3$, $PPh_3$, $AsPh_3$, $SbPh_3$, and $BiPh_3$ on gold and copper, Langmuir, 8, 90-4 (1992).
Tao, Structural comparison of self-assembled monolayers of n-alkanoic acids on the surfaces of silver, copper, and aluminum, J. Am. Chem. Soc., 115:4350-8 (1993).
Timmons et al., Investigation of fatty acid monolayers on metals by contact potential measurements, J Phys Chem, 69:984-990 (1965).
Ulman et al., Formation and structure of self-assembled monolayers, Chem. Rev., 96(4):1533-54 (1996).
Vettiger et al., The "Millipede"—more than thousand tips for future AFM storage, IBM J. Res. Dev., 44:323 (2000).
Walczak et al., Structure and interfacial properties of spontaneously adsorbed n-alkanethiolate monolayers on evaporated silver surfaces, J. Am. Chem. Soc., 113:2370-8 (1991).
Wasserman et al., Structure and reactivity of alkylsiloxane monolayers formed by reaction of alkyltrichlorosilanes on silicon substrates, Langmuir, 5:1074-1087 (1989).

(56) References Cited

OTHER PUBLICATIONS

Whitesides, Proceedings of the Robert A. Welch Foundation 39th Conference on Chemical Research Nanophase Chemistry, Houston, Texas, pp. 109-121 (1995).

Xia et al., Soft lithography, Angew Chem. Int. Ed., 37(5):550-75 (1998).

Xu et al., Surface coordination chemistry of $YBa_2Cu_3O_7$-L, Langmuir, 14:6505-11 (1998).

Yamamoto et al., Characterization of the surface to thiol bonding in self-assembled monolayer films of $C_{12}H_{25}SH$ on InP(100) by angle-resolved x-ray photoelectron spectroscopy, Langmuir, 15:8640-4 (1999).

Yonezawa et al., Layered nanocomposite of close-packed gold nanoparticles and TiO2 gel layers, Chem. Mater., 11:33-5 (1999).

Juan et al., Released Si microstructures fabricated by deep etching and shallow diffusion, J. Microelectromechanical Systems, 5(1):18-23 (1996).

\* cited by examiner

SILICON PEN NANOLITHOGRAPHY

CROSS REFERENCE TO RELATED APPLICATIONS

The benefit of U.S. Provisional Application No. 61/184,578, filed Jun. 5, 2009, and U.S. Provisional Application No. 61/350,349, filed Jun. 1, 2010, is claimed, and the disclosure of each is incorporated by reference in its entirety herein.

STATEMENT OF U.S. GOVERNMENTAL SUPPORT

This invention was made with U.S. government support under Space and Naval Warfare Systems Center Grant No. N66001-08-1-2044. The U.S. government has certain rights in this invention.

BACKGROUND

In the silicon industry, research into reducing feature size and registration is approximately $100 million/year, and these fabrication strategies are increasingly expensive and inaccessible to researchers. As an alternative, scanning probe lithography (SPL) has become increasingly popular in the fabrication of nanoscale structures as a consequence of its cost advantage, capability to achieve a high resolution, alignment accuracy exceeding most of the existing technologies, as well as reliability. In particular, molecular printing, defined as the deposition of molecules directly onto a surface with at least one feature dimension on the molecular scale, via tip-based scanning probe offers an alternative approach to creating nanoscale features with high resolution and low-cost. However, increasing the throughput, while maintaining the advantages of SPL, has been a significant challenge.

Recent advances in molecular printing have led to important advances in biotechnology, materials science, and electronics: leading to devices such as lab-on-a-chip assays, genetic and proteomic arrays, and novel memory device architectures, however, these applications are in their nascent stages because of the rapidly developing nature of molecular printing technologies and the lack of reliable strategies for increasing the throughput or reducing the feature sizes produced by these methods. Among the most familiar molecular printing methods are soft lithography and dip-pen nanolithography. Soft lithography refers to a class of molecular printing methods, including its most widely used incarnation microcontact printing (µCP), in which a patterned elastomeric stamp is pressed against a surface, leaving a pattern of molecules that mirrors the topography of the stamp. An advantage of soft lithography is the ability to pattern large areas, but the mechanical properties of the stamp limit the patterns that can be made by µCP: typically the feature sizes must be greater than 200 nm in diameter, and the patterns are limited by lateral collapse of the stamp when features are too close together and roof collapse when features are separated by too great a distance. SPL, in which a sharp stylus is attached to piezoelectric actuators is utilized to pattern a surface, has been widely investigated in the context of nano-patterning. Because of the mechanical strength of the hard AFM tips, techniques that involve the transfer of energy to a surface, such as scratching, etching, and oxidizing surfaces are well-established. Dip-pen nanolithography (DPN) is a scanning-probe based molecular printing method that uses the tip of an atomic force microscope (AFM) coated with an ink as a pen to transfer the ink directly onto a surface, and because the aqueous meniscus that forms between the tip and the surface serves as a conduit for ink transfer, there is a linear relation between the dwell time of the tip on the surface and the feature area. Because of the small tip diameter, lines with a width as small as 15 nm can be written on a single crystal Au surface, and as a result of the piezoelectric actuators that control the movement of the tip, arbitrary patterns with nanometer registration between features are an important capability of SPL. DPN has been used to write nanoscale patterns of nanoparticles, DNA, proteins, and various small molecules, resulting in applications such as gene chips, assays for the HIV-1 p24 antigen, bio-screening devices, gas sensors, and photomasks, but the slow writing speed of single-pen DPN limits it to prototyping applications. Massively parallel pen arrays of containing as many as 55,000 pens immobilized onto cantilevers have been microfabricated, but these arrays are expensive and difficult to use, so increasing the throughput of scanning probe lithographies remains an active area of investigation.

The issues of throughput for tip-based molecular printing methods have been addressed recently by the advent of Polymer Pen Lithography (PPL), a new tip-based molecular printing method that combines elements of DPN and soft lithography. PPL utilizes pen arrays containing as many as $10^7$ pyramidal tips, and these arrays are mounted onto the piezo-electric actuators of an AFM to create arbitrary patterns with nanoscale feature diameter and registration. PPL maintains the time-dependent feature size control characteristic of DPN, but also can use force-dependent feature size control due to the elastomeric tip deformation upon application of force. With the current state of PPL, a digitized pattern can be printed with sub-100-nm control over feature diameter and position, which enables the production of features with diameters ranging from 80 nm to greater than 10 µm in a single writing operation.

There is a need to develop a new massively parallel, tip-based molecular printing method that is convenient and can create sub-micron features beyond the limit of PPL, while maintaining the low-cost and ease of use characteristic of PPL.

SUMMARY

The present disclosure is directed to tip arrays comprising a plurality of tips fixed to an elastomeric backing layer. The tips comprise a metal, metalloid, and/or semi-conducting material, e.g., silicon, gallium sulfide, gallium nitride, and/or gallium arsenide, and each tip has a radius of curvature of less than 1 µm. In some embodiments, the tips have a radius of curvature of less than 500 nm, less than 100 nm, less than 50 nm, or less than 25 nm. The tips can have a height of less than 100 µm. The tips can have a diameter at the bottom of the tip (where fixed to the backing layer) of less than 100 µm or less than 50 µm. The tips can be arranged in the tip array in a regular periodic pattern. The tips can be identically shaped, such as pyramidal, or more specifically octagonal pyramidal.

The backing layer can be at least translucent, and in some cases, is substantially transparent. The backing layer can comprise an elastomeric polymer, such as, e.g., polydimethylsiloxane (PDMS). In some embodiments, the PDMS can comprise a trimethylsiloxy terminated vinylmethylsiloxane-dimethysiloxane copolymer, a methylhydrosiloxane-dimethylsiloxane copolymer, or a mixture thereof.

The tip array can optionally further include a rigid support to which the backing layer is adhered, the rigid support disposed opposite the tips of the tip array and parallel to the backing layer. In some embodiments, the rigid support comprises a glass slide. In various cases, the backing layer and rigid support are, together, at least translucent or are substantially transparent.

The tips and backing layer can have a combined thickness of less than 1 mm, and when a rigid support is present, the tips, backing layer, and rigid support can have a combined thickness of less than 5 mm or less than 1 mm.

The tip array can optionally further include a coating on the exposed surfaces of the tips and the surface of the backing layer adjacent to the tips. In some cases, the coating is a conductive coating. The tip array can optionally further include an adhesive layer between the tips and the backing layer. In some cases, the adhesive layer can comprise silicon dioxide.

In another aspect, discloses herein are methods of submicron scale patterning of a substrate surface. The method can comprise contacting the substrate surface with all or substantially all of the tips of a tip array as disclosed herein to form a pattern on the substrate surface, wherein the patterning comprises one or more processes selected from the group consisting of depositing ink, indenting the surface, puncturing the surface, cutting the surface, etching the surface, oxidizing the surface, desorbing a material from the surface, or combinations thereof. In some cases, all of the tips of the tip array are in contact with the substrate surface.

In various cases, the method can further comprise coating the tips of the tip array with a patterning composition, and, upon contact with the substrate surface, depositing the patterning composition onto the substrate surface and forming a substantially uniform first set of indicia with all or substantially all of the coated tips. The method can further comprise moving the tip array and/or the substrate surface and repeating the contacting step to form a second set of indicia, which can be the same size or a different size from the first set of indicia. The patterning can further comprise controlling lateral movement between the tip array and the substrate surface during contacting and/or between one or more contacting steps. The controlled movement can result in, e.g., lines and/or a preselected pattern.

In various embodiments, the substrate surface comprises a compressible material, and the method comprises forming a first set of indentations and/or holes in the substrate at each point of contact of the tip array with the substrate. A second set of holes and/or indentations can be formed by a second step of contacting the tips to the substrate surface. The first and second sets of indentations can have the same or different depths. The lateral movement of the tip array and/or substrate surface to form a linear scratch on the substrate surface.

In some embodiments, where the tip array further comprises a conductive coating, the method can further comprise applying a voltage across the tip array to transmit electrical energy through the coated tip to the substrate surface to form indicia on the substrate surface at points of contact of the tip to the substrate surface. In various specific cases, the substrate surface comprises a self assembled monolayer (SAM), and the method further comprises performing said contacting and applying steps to desorb the SAM from the substrate surface at points of contact with the tip array. In some cases, the method comprises etching the substrate surface with the electrical energy.

In the methods described herein, the indicia, indentations, or holes formed by the methods can have a feature size of less than 500 nm, less than 100 nm, less than 70 nm, or less than 50 nm.

The method can further comprise selecting an at least translucent backing layer material for the tip array and illuminating the tip array with incident light, wherein contacting the substrate surface comprises bringing the tip array and substrate surface towards each other until there is a change in reflection of the incident light from the backing layer in the vicinity of and/or above all or substantially all of the tips, the change in reflected light being indicative of contact between tip and substrate surface. The leveling of the tips is indicated without need of a laser feedback.

The method can further comprise leveling the tips of the tip array with respect to the substrate surface by selecting an at least translucent material for the backing layer; backlighting the tip array with incident light to cause internal reflection of the incident light from the internal surfaces of the backing layer, from the back surfaces of the tips, or both; bringing the tips of the tip array and the substrate surface together along a z-axis up to a point of contact between a subset of the tips with the substrate surface, contact indicated by increased intensity of reflected light from the backing layer proximate to each of a subset of tips in contact with the substrate surface, whereas no change in the intensity of reflected light proximate to other tips indicates non-contacting tips; and tilting one or both of the tip array and the substrate surface with respect to the other in response to differences in intensity of the reflected light from the internal surfaces of the backing layer, to achieve contact between the substrate surface and non-contacting tips, wherein said tilting is performed one or more times along x-, y-, and/or z-axes.

In another aspect, disclosed herein are methods of preparing a tip array as described herein, the method comprising providing a silicon wafer; adhering an elastomeric backing layer to the silicon wafer to form a structure; forming a mask pattern over the silicon wafer to form pre-tip regions; and etching the silicon pre-tip regions and silicon between pre-tip regions with an etching solution to form pyramidal silicon tips attached to the backing layer. The method can optionally further comprise thermally oxidizing the silicon wafer to form a silicon oxide layer as a mask material. In some cases, the adhering step can comprise adhering the silicon wafer to an uncured backing layer and then curing the backing layer. The method can optionally further comprise passivating the edges of the silicon wafer with a passivating material prior to etching. The passivating material can be the same material as the backing layer. In some cases, the backing material and/or passivating material comprises PDMS. In various cases, the backing layer can further comprise a rigid support, e.g., a glass slide, disposed opposite the tips of the tip array and parallel to the backing layer. In various embodiments, the silicon wafer optionally has an intermediate layer to improve adhesion to the elastomeric backing layer. In some cases, the intermediate layer comprises a silicon dioxide layer. In various embodiments, the etching solution can comprise potassium hydroxide. In some cases, the method further comprises etching the silicon wafer comprising pre-tip regions with unbuffered hydrofluoric acid (HF) to remove native oxide from the surface of the silicon regions prior to etching with KOH. In various cases, the method can comprise selectively etching the silicon dioxide layer with hydrofluoric acid (HF) to form the mask pattern.

DETAILED DESCRIPTION

Described herein is a new massively parallel, hybrid tip-based molecular printing method, which can be termed massively-parallel hybrid silicon pen nanolithography (MPH-SPN) when silicon is used for the tip material. The method and apparatus employs an array of tips, e.g. Si tips, mounted onto a backing layer to create patterns of molecules on surfaces with features as small as 30 nm in diameter over large area. While the tips described herein are described in the context of silicon or silicon-containing tips, the invention is not so limited, and can comprise a metal, metalloid, a semiconducting material, and/or combinations thereof. For example, silicon nitride AFM probes, coated and/or functionalized AFM probes (e.g. metal carbide coated. plasma treated, silanized), diamond AFM probes, gallium containing materials (e.g., gallium nitride, gallium sulfide, gallium arsenide), and other semi-conducting materials are known in the art. MPH-SPN provides a new way of fabricating massively parallel arrays of tips with an average radius of curvature of, e.g., down to 22 nm or even less. An elastomeric backing reduces cost of fabrication because it circumvents the necessity for micromachined cantilevers, and enables an easy alignment protocol so that all the tips can be brought into contact with the surface simultaneously without necessitating a complex feedback scheme. MPH-SPN demonstrates time-dependent feature size that is analogous to DPN, but there is no relation between the force and the feature size, which is an important difference between MPH-SPN and polymer pen lithography (PPL), another massively-parallel tip-based lithography. Because of the lack of force dependence, MPH-SPN can write features as small as 34 nm, and in addition, because the tips are hard, they can transfer energy to the surface to form a pattern, rather than deforming, as in PPL.

To demonstrate the capabilities of MPH-SPN, arbitrary patterns of 7000 dots per pens have been written with 5,000 pen cm$^{-2}$ MPH-SPN array, where the average feature size is only 41±7 nm, by depositing ink directly onto a surface, and patterns have also been written by mechanically indenting polymer surfaces and electrically erasing molecules from a surface. Because of the low-cost ability to write in massively parallel fashion, the sub-50 nm feature size, and ability to transfer energy as well as molecules to a surface, MPH-SPN is a nanolithography strategy that should be widely adopted by the research, and possibly industrial communities.

Figure 1:
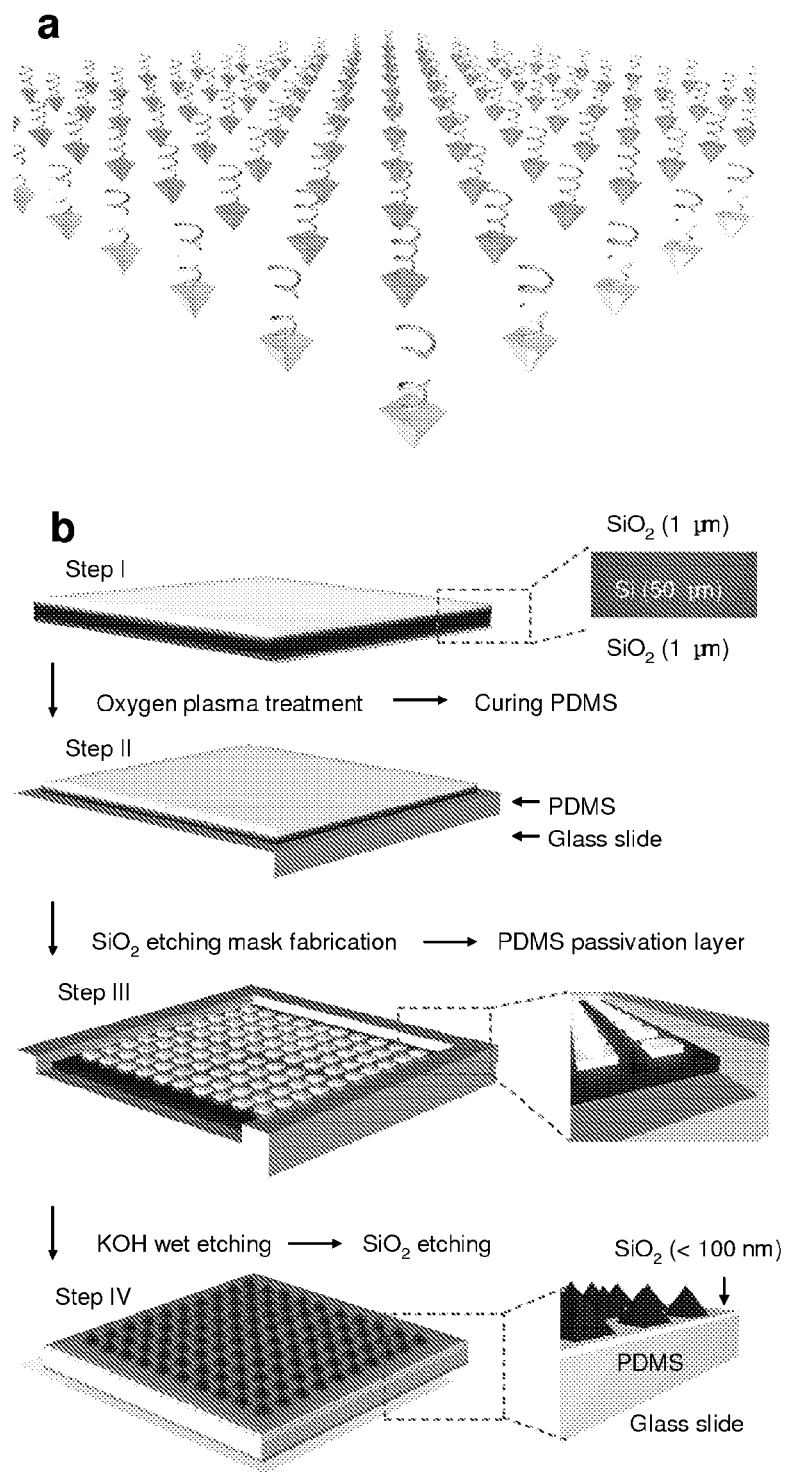
FIG. 1 shows a schematic of fabrication of Si pen arrays: a, schematic representation of massively parallel Si pen array supported by a transparent and soft backing layer that provides mechanical flexibility to each pen. b, schematic illustration of experimental procedure to fabricate the pen array: (Step I) 50-μm-thick (100) Si wafers with thermally oxidized SiO$_2$ (1-μm thick) in both sides were used; (Step II) an oxygen-plasma treated Si wafer to increase adhesion is placed onto, e.g., uncured polydimethylsiloxane (PDMS) on glass slide, followed by curing; (Step III) an array of square $SiO_2$ masks of different edge length (100-200 µm, 5 µm interval) along <110> direction is defined by conventional photolithography and an isotropic buffered hydrofluoric acid (HF) etch, another PDMS passivation layer on the edge of the Si wafer prior to etching is made to protect (110) plane that etches faster than (100) plane in KOH, in order to maintain homogeneous etching; (Step IV) the array of tips are formed in a 40 wt % KOH solution at 75° C. and rotated in the center of the etchant in a Teflon holder; after 60-65 min, when the sample became transparent due to transparency of $SiO_2$/PDMS/glass slide, the sample was removed from the etchant, rinsed in water and dried using nitrogen, and as necessary, further $SiO_2$ etching is conducted in HF for high flexibility of backing layer.

Major advances in scanning probe lithographies are often the result of novel tip designs and fabrication procedures, and the key innovation that enables MPH-SPN is a new protocol for fabricating massively parallel arrays of ultra-sharp Si tips on a spring-like elastomer layer that allow all tips to be brought into contact simultaneously and produce features as small as 30 nm in diameter over large areas (FIG. 1a). The architecture of the MPH-SPN arrays is comprised of the massively-parallel Si tips attached to a layer of elastomer that rests on a glass slide. The Si tips, prepared by a self-sharpening wet etching protocol, have a radius of curvature of about 22 nm, thereby enabling the easy preparation of sub-50 nm features in a pattern. Because the tip arrays can be prepared on a glass slide, these arrays can be easily mounted onto the piezoelectric actuators of a conventional AFM, which provides the precise tip positioning and registration that are hallmarks of scanning probe lithographies. Both the elastomer and glass onto which the arrays are mounted can be selected to be transparent, which enables the compression of the elastomer that occurs when the tips touch the surface of a substrate to be observed visually, thereby enabling a straightforward, optical method for leveling the plane of the tip array with respect to the substrate surface, when desired.

The preferred tip-array fabrication protocol described herein involves two major steps, photolithography and a self-sharpening etching step (FIG. 1b). Importantly, no micromachining steps are required, thereby reducing significantly the manufacturing costs to about $10 for a 1×1 cm pen array, whereas a single, cantilever-bound AFM probe costs about $40. Depending on the intended use, the pitch of a pen array can be deliberately set between 100 and 200 µm, corresponding to tip densities of 10,000/cm$^2$ and 2,500/cm$^2$, respectively, and the density can be as high as 111,110/cm$^2$ (9,007, 700 tips in a 4-inch wafer) with a pitch of 30-µm, for example.

The method can include the steps of providing a substrate wafer (e.g., silicon) from which the tips will be formed; adhering an elastomeric backing layer to the wafer to form a structure; and etching the wafer material to form tips attached to the backing layer. Preferably, a mask pattern is formed over the wafer prior to etching, to form pre-tip regions.

Figure 5:
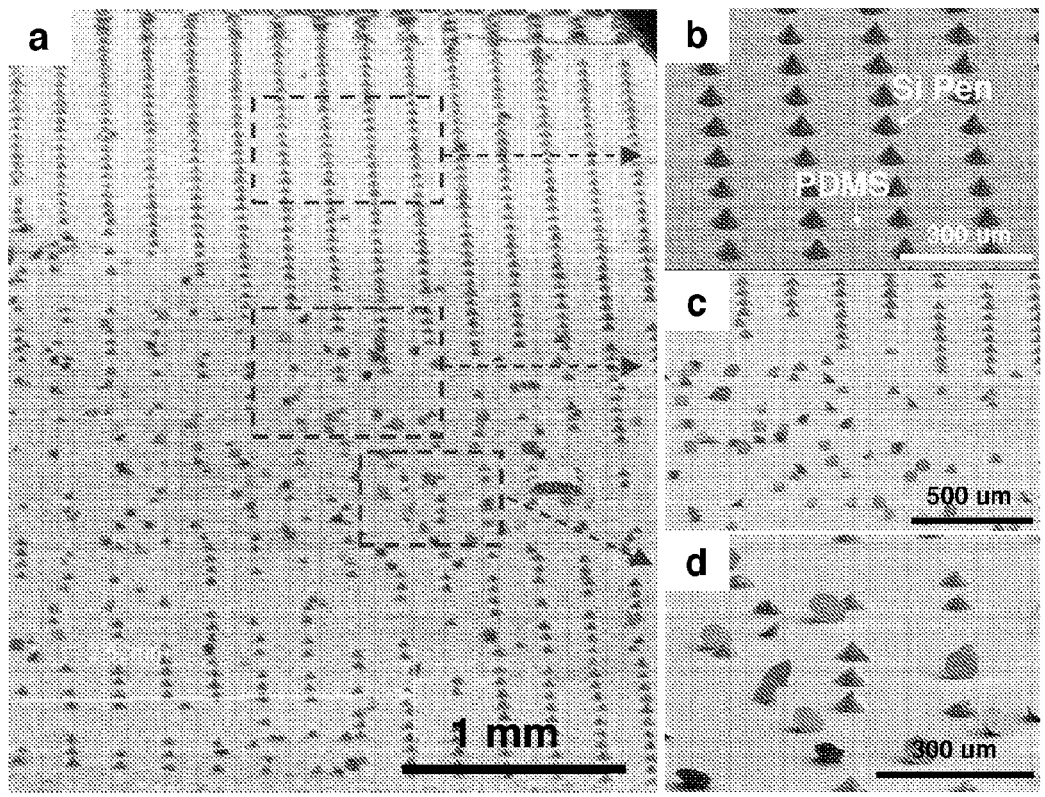
FIG. 5(a) SEM images of Si pen array after KOH etching (40 wt %, 75° C. for 65 min) with isopropyl alcohol, Si substrate attached directly to PDMS without $SiO_2$ passivation layer resulted in Si pens falling from PDMS surface during etching; the swelling of PDMS in solution at relatively high temperatures may cause the interfacial stress that weakens the adhesion of Si to PDMS; employing a $SiO_2$ passivation layer was found to significantly improve the stability of Si pen on a surface during etching; (b)-(d) show magnified images of different regions of (a).

As an example, to make the pen arrays, a Si wafer (e.g., 1×1 cm piece of a 50 µm-thick (100)), optionally with a layer of silicon dioxide (SiO$_2$) (e.g., 1 µm thick) on each side of the wafer, was placed onto uncured elastomer. The top layer of SiO$_2$ can serve as an etching mask material, while the SiO$_2$ layer of the wafer in contact with the backing layer can increase adhesion between the two surfaces, so that the tips do not fall off a certain PDMS elastomeric backing material once the wafer has been etched (FIG. 5). Following an optional curing of elastomer of the backing layer, an array of square SiO$_2$ masks over silicon (e.g, pre-tip regions) are prepared from the top SiO$_2$ layer along the <110> axis of the wafer by conventional photolithography and a subsequent buffered hydrofluoric acid (HF) etch. The tips are prepared by etching the Si of the pre-tip regions and Si between pre-tip regions in an etching solution, e.g., 40% (w/v) aqueous potassium hydroxide (KOH) solution that etches the (311) and the (100) planes of the wafer at rates of 88 and 50 µm/hr, respectively. In one preferred embodiment, during the etching, the Si wafer is embedded in the elastomer or backing layer (e.g., PDMS) so that the sides of the wafer are not exposed to the etching solution, thereby protecting the (110) crystal face exposed on the sides that would etch faster than the (100) face on the surface. In other embodiments, the sides of the wafer can be protected from etchant by any other suitable methods and materials, as would be recognized by the skilled artisan. The sidewall etching rate, $R_w/\cos\theta$ ($\theta$ is a slope of sidewall), must exceed the surface etching rate, $R_f$ in order to form sharp Si tips. Thus the anisotropy ratio $\eta_c$ and the condition for self-sharpening points is expressed as $\eta=R_f/R_w \leq 1/\cos\theta=\eta_c$, which indicates that faster etching rate for sidewall than that of floor is required to form a sharp tip. For (311) sidewall and (100) floor, the experimental $\eta=R_{(100)}/R_{(311)}$ was measured as 0.56 in 40 wt % KOH at 70° C., while theoretical $\eta_c$ is 3.33. This parameter can be changed to altering the weight % of the KOH and/or the temperature at which the etching occurs. Other etching solutions that etch silicon anisotropically include ethylenediamine/pyrocathecol/water and tretramethylammonium hydroxide.

Figure 2:
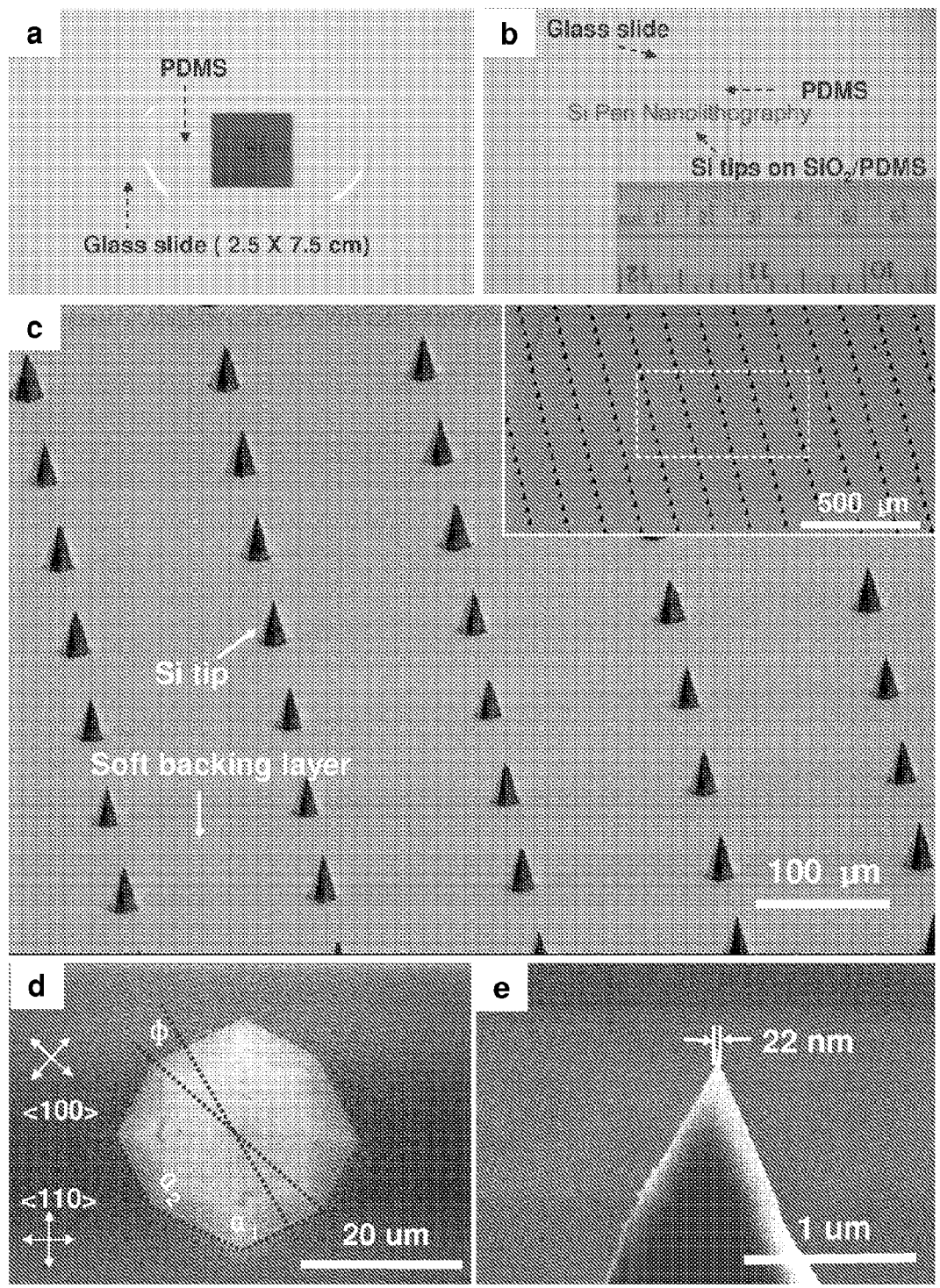
FIG. 2 shows fabricated Si pen arrays on $SiO_2$/PDMS/glass: a, Si wafer (2×2 cm) on a cured PDMS surface on a glass slide before etching and b, an actual pen array after etching in KOH. c, a SEM image of the Si pen array on $SiO_2$/PDMS/glass with 160 µm in pitch that are uniform with bottom width 30±0.6 µm corresponding to about 47±0.9 µm in pen height; the pen height may vary up to 10% in optimized condition, since the original wafer itself used as a starting material in this experiment has a variation of 10% in thickness; the inset shows the array in a large area that shows the homogeneity of the pens; d, (311) planes were introduced during the wet etching with <110> oriented masks on a (100) Si surface. The measured surface intersection angles, $\alpha_1$ and $\alpha_2$, as defined in this figure were 126.9° and 143.1° that correspond to the tip defining planes of (311); rotation of the intersection of planes to <100>, $\phi$, was 18.4°, and also showed that the tip plane is (311); e, the tip radius of curvature was 22±3 nm.
Figure 6:
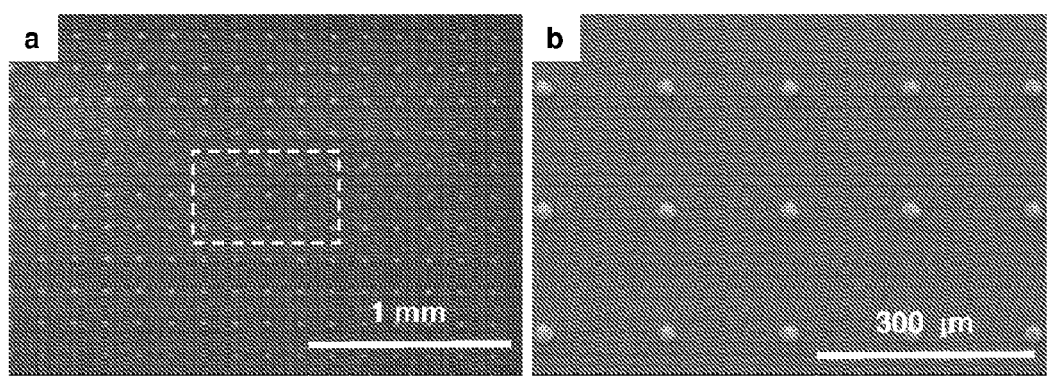
FIG. 6(a) top-view SEM image of Si pen array with 160 µm in pitch that are uniform with bottom width 30±0.6 µm corresponding to about 47±0.9 µm in tip height; a magnified image of (a) is shown in (b).

Analysis of the resulting tip arrays reveals that this fabrication protocol does indeed achieve massively parallel Si pen arrays with tip radii of about 22 nm (FIG. 2). The massively parallel Si pen array is immobilized onto a glass slide (FIG. 2a), which is a rigid support for the arrays, allows handling of the fragile pen array without damage, and is a platform for mounting the arrays onto the AFM. In a preferred embodiment, the elastomeric backing and rigid support together are transparent (FIG. 2b), which enables the visual leveling alignment of the tips onto a surface. A scanning electron microscope (SEM) image of the tips with 160 µm in pitch shows that the tips are remarkably uniform with bottom width 30±0.6 µm (FIG. 6), corresponding to a tip height of 47±0.9 µm, and that they adhere well to the elastomer surface (FIG.

2c). It was found by SEM that the surface intersection angles, α1, α2, and the rotation of the intersection of the planes to the <100> plane of the wafer, φ, are 127.2, 143.3, and 18.3° (FIG. 2d), respectively, which demonstrates that the sidewall of the tips is (311) plane because the value of angles correspond perfectly to theoretical value of those for (311) of 126.9, 143.1, and 18.4°, respectively. Importantly, the Si tip radius of the arrays is found to be 22±3 nm (FIG. 2e), demonstrating that self-sharpening has been achieved under the etching conditions of 40% KOH in $H_2O$. The tip radius can be reduced to 5 nm by changing the etching conditions, e.g., changing the KOH concentration and solution temperature during etching. This etching protocol, with a $SiO_2$ etching mask and homogeneous KOH etching provides a tip yield >99%. Since the wafer used in this experiment has a thickness variation of 10% (50±5 μm, NOVA Electronic Materials Ltd., TX), the tip height can vary up to 10%.

Figure 3:
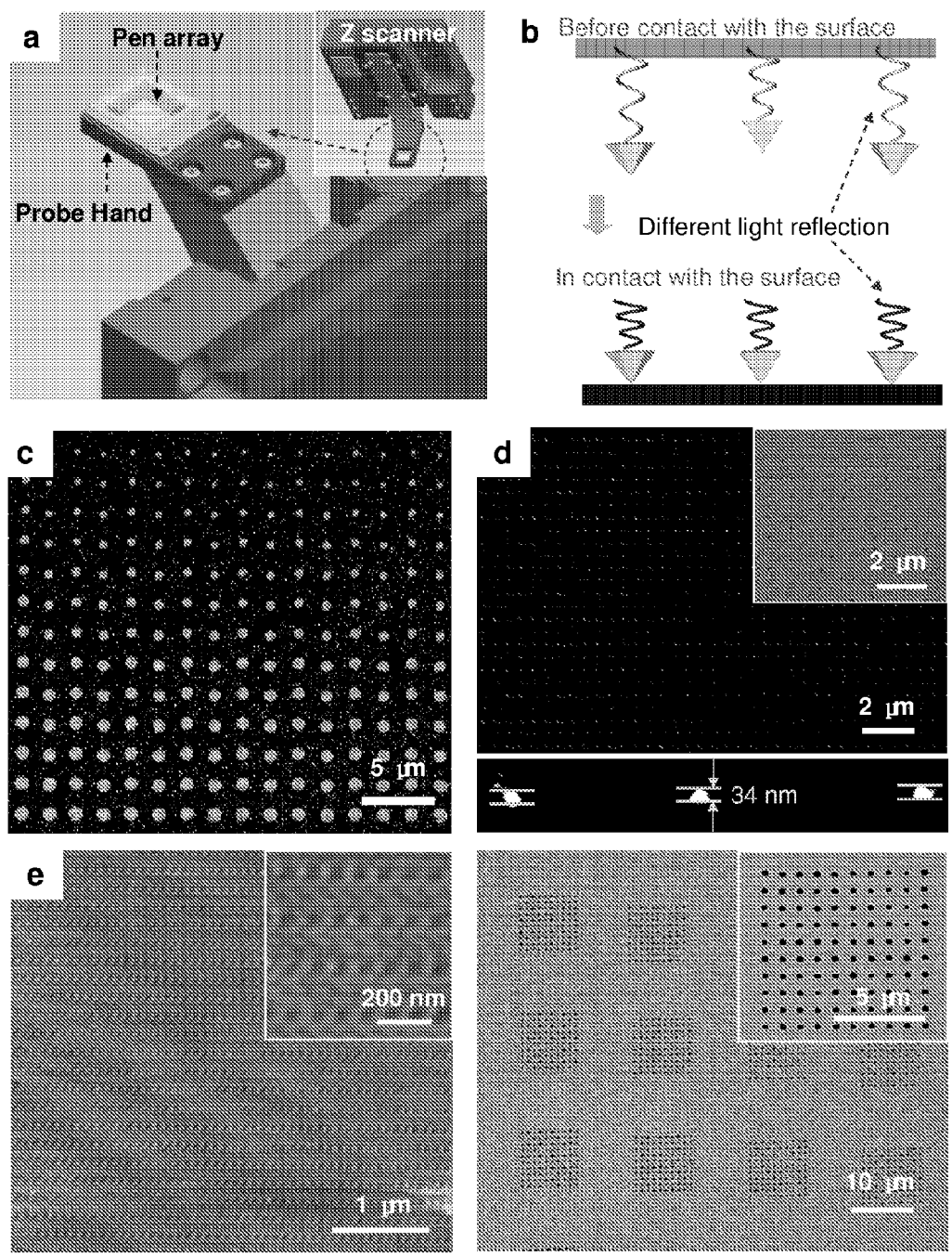
FIG. 3 shows the operating principles and single pen capabilities of the disclosed methods: a, schematic of a pen array attached to probe hand of 25 µm z-piezo scanner that provides 10 mm by 10 mm panning optical view for aligning tips to a surface with tilting stage; b, schematic of alignment protocol for SiPN; when the pressure is applied to the glass support, the PDMS layer serves as elastomeric springs so that all tips are brought into contact with the substrate simultaneously. The amount of light reflected from the backside of tips varies greatly when the tips make contact with the surface compared to when the tips are not in contact with the surface; when the sharp tips of the Si pens are brought in contact with a substrate, materials or energies can be delivered at the points of contact; c, SEM image of a pattern of Au dots of different sizes on an Si surface created by intentionally varying the dwell time (15, 14, 13, 12, 11, 10, 7, 6, 5, 4, 3, 2, and 1 s, FIG. S4) of 10 mM MHA at a humidity of 50%; d, SEM image of a pattern of Au dots on an Si surface with dwell time of 0.01 s of 5 mM MHA at a humidity of 15%; the inset (bottom) shows a magnified SEM image of Au dots; the inset (top-right) shows a LFM image of MHA dot pattern before Au etching; e, AFM topographical image of dot pattern of PMMA prepared by indentation with Si pen at room temperature; the inset shows a magnified image; f, SEM image of Au hole patterns created by Au etching after removing MHA SAM at bias voltage of −5 V with dwell time of 5 s and a humidity of 30%.

The ability to print arbitrary patterns of molecules directly onto a surface with sub-50 nm feature diameter in a massively parallel fashion sets MPH-SPN apart from other patterning methods. The molecular printing capabilities of MPH-SPN, including the ability to make arbitrary patterns, time-dependent feature diameter control, and the reproducible, repeated printing of sub-50 nm features, were demonstrated by printing 16-mercaptorhexadecanoic acid (MHA) onto a thermally evaporated polycrystalline Au surface. When MHA is deposited onto a Au surface, it forms a self-assembled monolayer (SAM) on the Au surface as a result of the formation of Au—S bonds. Importantly, the Au can be etched selectively from the regions not coated by the MHA, leaving Au nanostructures that are easily characterized by SEM. The MPH-SPN tip arrays were inked by spin coating an ethanolic solution of MHA onto the pen arrays, which were subsequently mounted onto a XE-150 AFM platform (Park Systems, Korea) that was specially equipped with a tilt stage, an environmental chamber for controlling humidity, a specialized scanning head (FIG. 3a), and lithography software capable of controlling the position, dwell time, and z-piezo extension for each feature in a pattern. In a departure from DPN, during writing, there is no need for laser feedback; rather the compression of elastomer as the tips push against the surface, and the resulting change in appearance, is used to indicate that the tips are in contact with the surface and that writing is occurring. This optical signal is also used to level the plane of the tip array with respect to the plane of the surface: the tilt angle of the pen array is adjusted until, upon z-piezo extension, all the tips contact the surface simultaneously (FIG. 3b). As a demonstration of the resiliency of the tip architecture, the z-piezo has been extended as far as 100 μm after the tips have touched the surface, and upon retraction the tips rebounded without breaking off the support.

Figure 7:
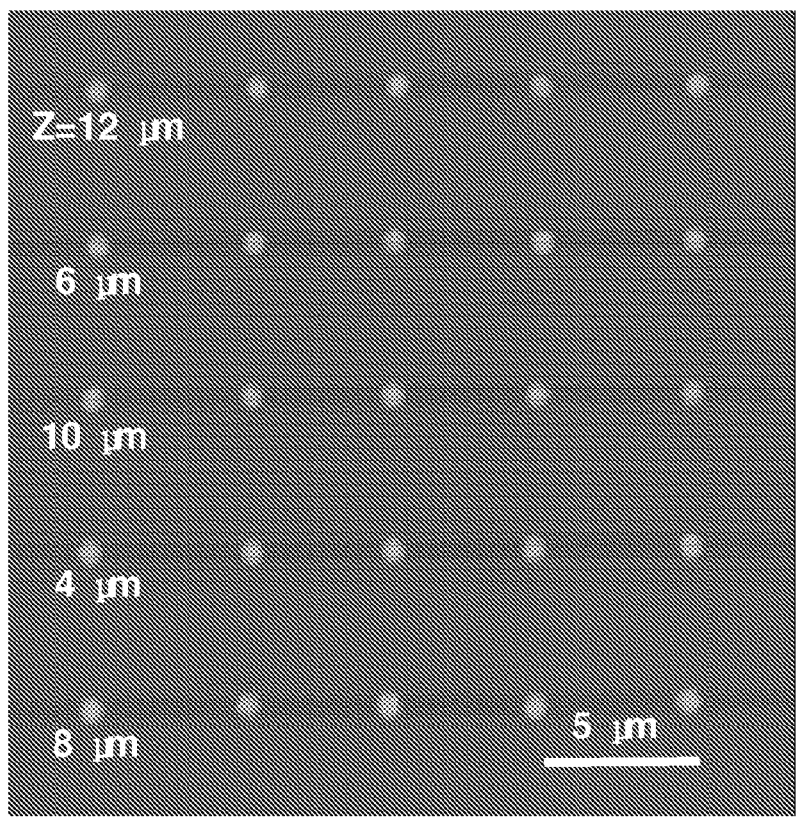
FIG. 7 shows a force dependence experiment of poly(ethylene glycol) (PEG) feature size variation at different z-piezo extensions (humidity of 90%) ; the z-piezo extensions and measured diameter of the PEG dots are the following: 12 µm, 554±22 nm; 10 µm, 557 ±22 nm; 8 µm, 584±22 nm; 6 µm, 564±27 nm; 4 µm, 561±24 nm; the average of all 25 PEG dots is 564±23 nm, which shows that the feature size by Si pens does not vary with force applied during leveling and patterning.
Figure 8:
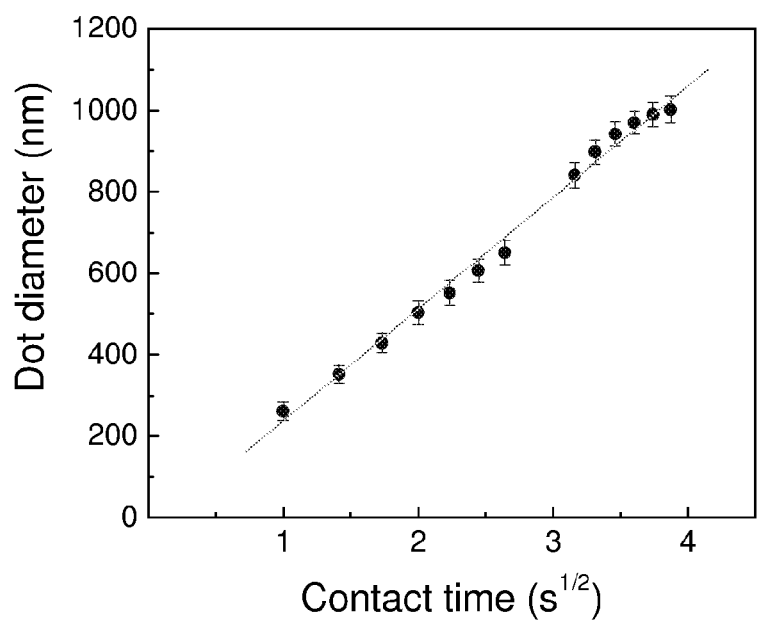
FIG. 8 shows the time dependence of Au dot feature size variation after MHA transfer at a humidity of 50% followed by Au etching; the time of MHA deposition and measured diameter of the Au dots are the following: 15 s, 1002±32 nm; 14 s, 990±30 nm; 13 s, 970±28 nm; 12 s, 942±30 nm; 11 s, 897±30 nm; 10 s, 840±31 nm; 7 s, 651±31 nm; 6 s, 606±29 nm; 5 s, 551±31 nm; 4 s, 503±28 nm; 3 s, 429±24 nm; 2 s, 352±22 nm; 1 s, 261±22 nm; under the experimental conditions, lower humidity was required to obtain the smaller feature size.

In PPL, there is a linear relationship between the force between the pen array and the surface and the resulting feature edge length because of the compression of the polymeric tips, however in MPH-SPN, no such relationship is observed because the Si tips do not deform under pressure. The force-independent nature of MPH-SPN was shown by the following experiment. Poly(ethylene glycol) was written onto a hexamethyldisilazane (HMDS)-coated Si surface with a dwell time of 0.5 s, a humidity of 80%, and z-piezo extension values ranging from 4 to 12 μm without any significant deviation in the size of the features written by any single pen (FIG. 7). This lack of feature size dependence on force observed in this pattern illustrates how all pens in MPH-SPN arrays can be brought into contact with a surface by extending the z-piezo until all tips are in contact with the surface while not affecting the feature sizes as a consequence of increasing the force exerted on the first pens to contact the surface. In DPN precise control of feature diameter is achieved because the ink diffuses through the meniscus that forms between the tip and the surface, thereby resulting in a linear relationship between feature area and dwell time$^{1/2}$. This relationship between feature and dwell time was investigated in the context of a MPH-SPN experiment by writing a pattern where the feature dwell times were varied. The dots written at dwell times from 1 s to 15 s at 50% humidity resulted in features with diameters from 261±22 to 1002±32 nm, respectively (FIG. 3c), showing that this linear relation is maintained (FIG. 8), although there seemed to be a saturation of feature size above dwell times of 13 s under the particular experimental conditions. When the humidity was lowered to 15%, features as small 34±3 nm were reproducibly obtained with a dwell time of 0.01 s (FIG. 3d).

Figure 9:
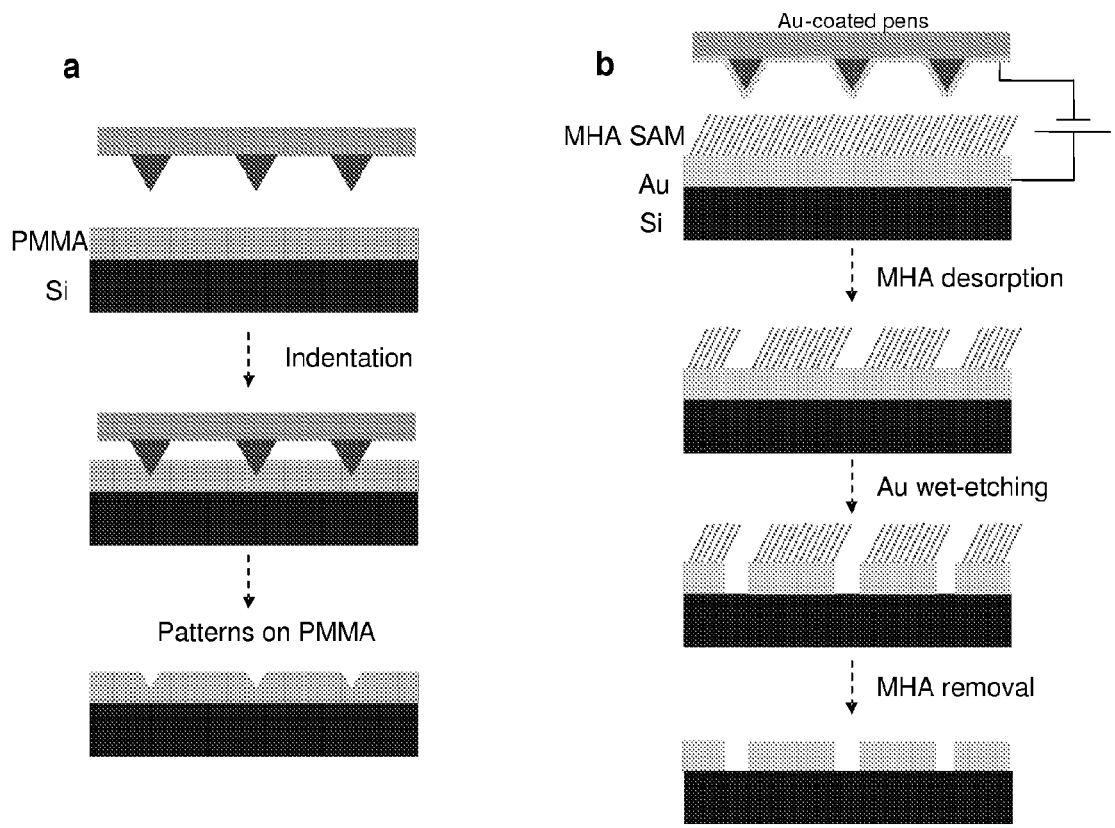
FIGS. 9 shows a schematic illustration of (a) the fabrication of nanoscopic indentations by mechanical contacts onto a surface and (b) the selective desorption of MHA features by electric field followed by Au wet etching.
Figure 10:
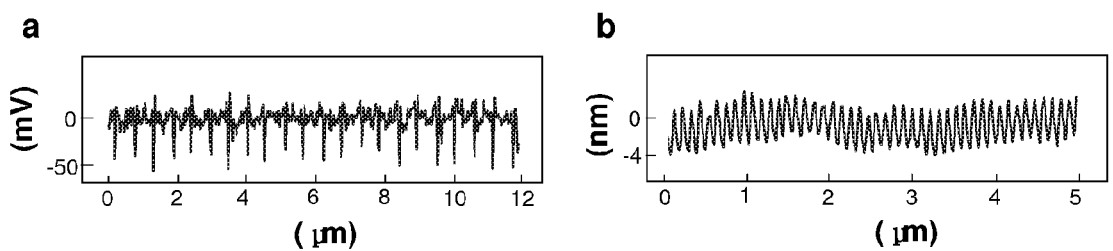
FIG. 10 shows (a) LFM line profile of MHA dot array (0.01 s contact time, 15% humidity) before Au etching, full width at half maximum (FWHM) is 42±5 nm; (b) height profile of hole patterns on PMMA by indentation with Si pen, FWHM is 38±4 nm.

Moreover, the ability to transfer energy, rather than materials (ink), to a surface was demonstrated by these Si pen arrays (FIG. 9). MPH-SPN was used to make an array of holes in a PMMA surface. The pen arrays were lowered into the polymer with an extension of 1 μm, humidity of 30% and a 0.5 s contact time, which resulted in holes with an average depth of 5.1±0.8 nm and a width of 38±4 nm with a pitch distance of 100 nm (FIG. 3e and FIG. 10); thus the pattern density is 65 gigabye (Gb) in$^{-2}$. This result is particularly important if the technique is used to generate high-density data storage applications on a polymeric film at a large scale.

To show that these pen arrays could also transfer electrical energy to a surface, the pen arrays were coated with Au, attached to a voltage source, and brought into contact with a Au surface coated with MHA. Following the application of −5 V for with a contact time of 5 s at a humidity of 30% to selectively remove MHA SAM, the Au was etched from the areas where the SAM was removed, which corresponded to locations where voltage had been applied, leaving an array of holes (FIG. 3f).

Figure 4:
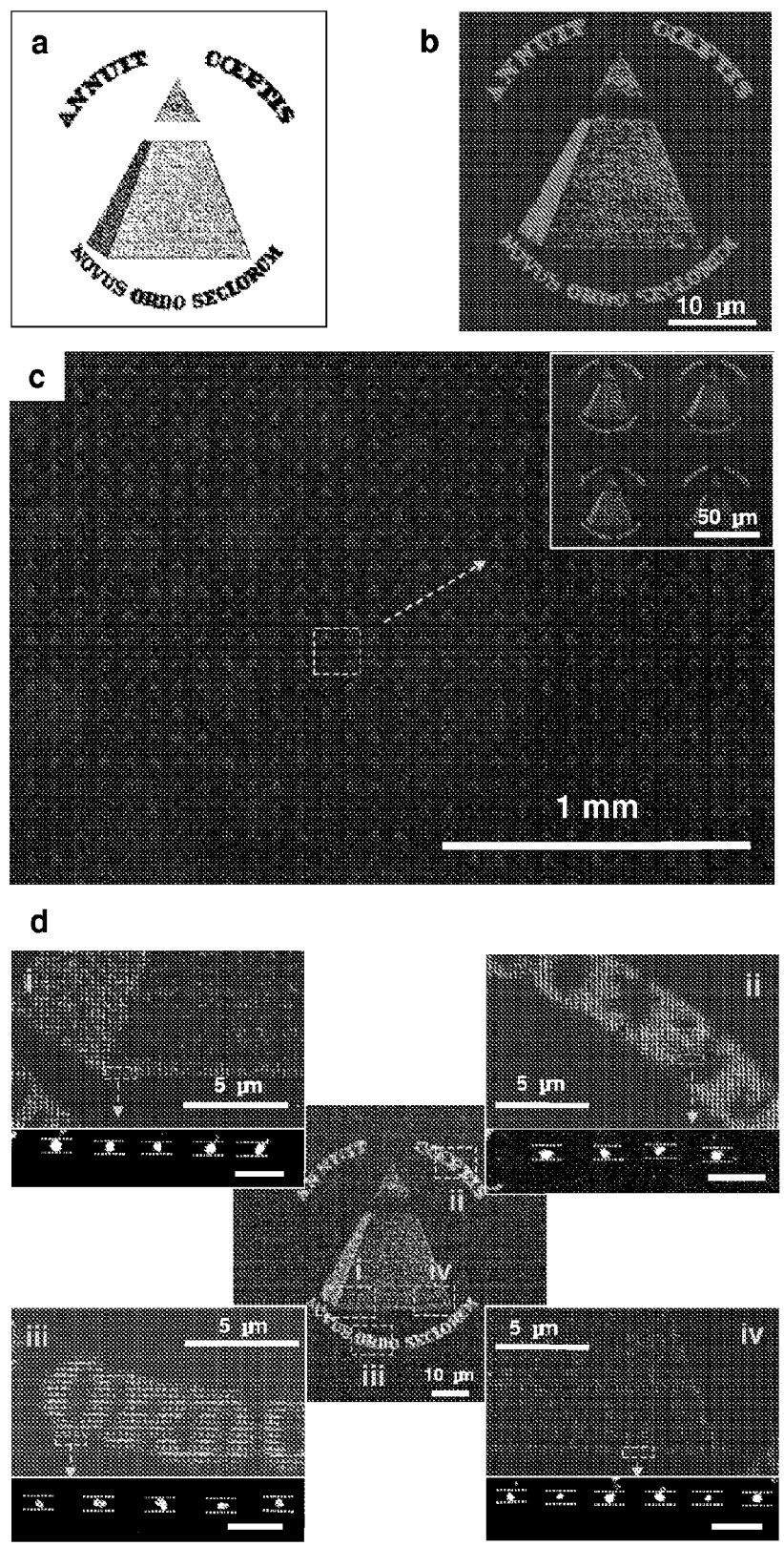
FIG. 4 shows parallelization of serial writing in a high resolution: a, Dot matrix map representing the image of pyramid from a US one-dollar bill; the image consists of 6,982 dots; b, SEM image of resulting Au pattern with the size of 30×33 µm and the distance of 150 nm between dots; c, SEM image of a representative region of about 20,000 duplicates of pyramid from a US one-dollar bill; the size of each duplicate is 55×60 µm and the distance of 270 nm between dots; the inset shows a magnified SEM image of four pyramid replica; e, SEM image of a representative replica of 55×60 µm in size (middle); a magnified image of (i) bottom-left corner of pyramid, (ii) top-right letters "OCEPTIS", (iii) bottom letters "ORDO", and (iv) bottom-right corner of pyramid, each scale bar of images of (i)-(iv) is 270 nm; each inset shows a magnified image of each marked region that presents individual dots of 41±7 nm in size.
Figure 11:
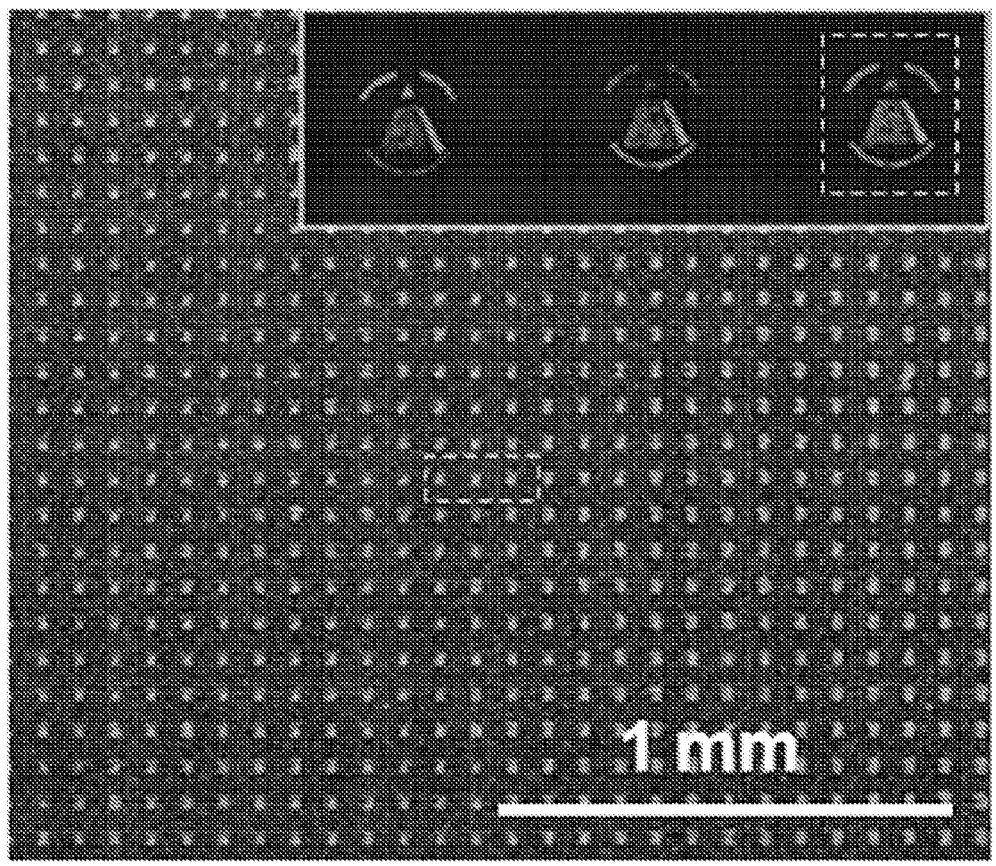
FIG. 11 shows (a) SEM image of a representative region of about 15,000 duplicates of pyramid from a US dollar bill (0.01 s contact time, 40% humidity); the size of each duplicate is 30×33 µm and the distance of 150 nm between dots; the inset shows a magnified SEM image of three pyramid replicas.

What distinguished MPH-SPN from DPN and PPL is the ability to form massively parallel, arbitrary patterns with features smaller than 50 nm in diameter. As a demonstration of these capabilities, a bitmap representation of the pyramid on the US dollar bill was loaded into the custom software, which converted the image into a dot-matrix representation. The computer-generated pattern is comprised of 6,982 dots with the corresponding position coordinates and necessary dwell time necessary for each dot (FIG. 4a). The pattern was written by inking the 5,000 pen MPH-SPN array (1 cm×1 cm) with MHA and writing onto a Au surface (0.01 s in contact time and 40% in humidity). FIGS. 4a and b show bit map image and resulting Au patterned image of 30 by 33 μm (FIG. 11). The complex patterns were accurately reproduced from their bitmap images; registration between features was 150 nm. In order to clearly resolve individual dots, the image size was increased to 55 by 60 μm (270-nm-distance between dots) while maintaining the number of 6,982 dots (0.01s in contact time and 30% in humidity). A representative portion of about 20,000 replicas (yield>99%) generated across the 1-cm$^2$ substrate shows their uniformity (FIG. 4c). The uniformity of patterns can be affected by variations in surface etching, tip morphology, and ink coating. Importantly, at the edge of patterns (FIG. 4d), individual dots were clearly seen, and its feature size was 41±7 nm as shown in magnified images of i-iv in FIG. 4. The total time required to fabricate all of these features was about 50 min, and this time can be reduced with higher speed of scanner.

Figure 12:
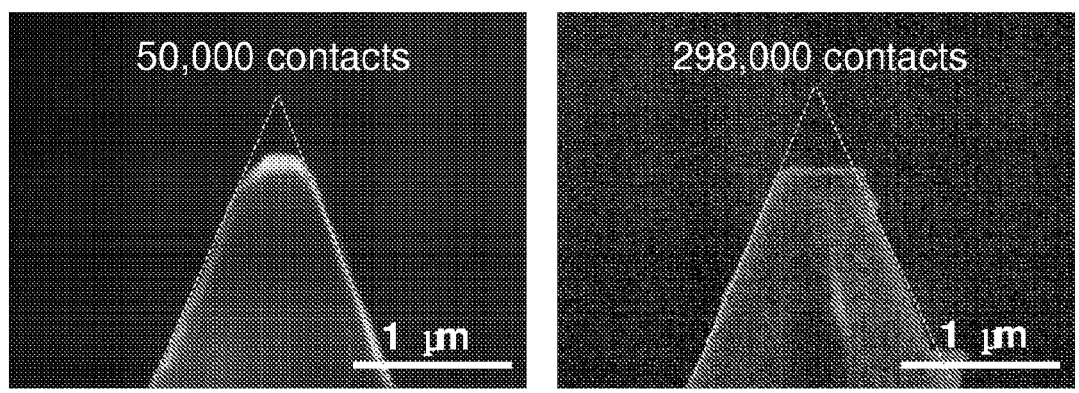
FIG. 12 shows SEM images of a Si pen after wear; the dotted lines show the outline of the pen prior to the wear experiment; pen was worn by making a contact to a surface (a) 50,000 and (b) 298,000 times in ambient conditions.

It is a well known that AFM styluses composed of Si wear after extended usage. To investigate this phenomenon, the array of mounted tips made according to the process described herein were imaged by SEM to evaluate the effect of the repeated contacting of the surface by the pens on the shape of the tip. Indeed, it was found that significant wear occurs, dulling the pen tips after 50,000 contacts (FIG. 12). As a result, to achieve the smallest feature diameters, only new tip arrays as disclosed herein should be used. Older, used, pens may still be useful for patterning larger feature sizes. Additionally or alternatively, the pens can be resharpened by exposure to an etching solution, e.g., KOH.

In summary, demonstrated herein is a new tip-based nanopatterning method, termed MPH-SPM, capable of creating massively parallel patterns of features with diameters as small as 34 nm in serial fashion by either the direct deposition of molecules to a surface or the transfer of energy to a surface. Importantly, the cost of each pen array is less than the cost of a single AFM tip, and could be carried out using conventional AFM apparatuses.

Silicon Pen Tip Arrays

The tip arrays disclosed herein comprise a plurality of tips (e.g., silicon or silicon-containing) fixed to an elastomeric backing layer. The backing layer can be at least translucent, or preferably substantially transparent. The backing layer can have any suitable thickness, for example in a range of about 50 μm to about 1000 μm, about 50 μm to about 500 μm, about 50 μm to about 250 μm, or about 50 μm to about 200 μm, or about 50 μm to about 100 μm.

The elastomeric backing layer comprises an elastomeric polymeric material. Polymeric materials suitable for use in the backing layer can have linear or branched backbones, and can be crosslinked or non-crosslinked. Cross-linkers refer to multi-functional monomers capable of forming two or more covalent bonds between polymer molecules. Non-limiting examples of cross-linkers include such as trimethylolpropane trimethacrylate (TMPTMA), divinylbenzene, di-epoxies, tri-epoxies, tetra-epoxies, di-vinyl ethers, tri-vinyl ethers, tetra-vinyl ethers, and combinations thereof.

Thermoplastic or thermosetting polymers can be used, as can crosslinked elastomers. In general, the polymers can be porous and/or amorphous. A variety of elastomeric polymeric materials are contemplated, including polymers of the general classes of silicone polymers and epoxy polymers. Polymers having low glass transition temperatures such as, for example, below 25° C. or more preferably below –50° C., can be used. Diglycidyl ethers of bisphenol A can be used, in addition to compounds based on aromatic amine, triazine, and cycloaliphatic backbones. Another example includes Novolac polymers. Other contemplated elastomeric polymers include methylchlorosilanes, ethylchlorosilanes, and phenylchlorosilanes, polydimethylsiloxane (PDMS). Other materials include polyethylene, polystyrene, polybutadiene, polyurethane, polyisoprene, polyacrylic rubber, fluorosilicone rubber, and fluoroelastomers.

Further examples of suitable polymers that may be used in the backing layer can be found in U.S. Pat. Nos. 5,776,748; 6,596,346; and 6,500,549, each of which is hereby incorporated by reference in its entirety. Other suitable polymers include those disclosed by He et al., *Langmuir* 2003, 19, 6982-6986; Donzel et al., *Adv. Mater.* 2001, 13, 1164-1167; and Martin et al., *Langmuir,* 1998, 14-15, 3791-3795. Hydrophobic polymers such as polydimethylsiloxane can be modified either chemically or physically by, for example, exposure to a solution of a strong oxidizer or to an oxygen plasma. In some cases, the elastomeric polymer is a mixture of vinyl and hydrosilane prepolymers, where the weight ratio of vinyl prepolymer to hydrosilane crosslinker is about 5:1 to about 20:1, about 7:1 to about 15:1, or about 8:1 to about 12:1.

The tips of the tip array can be any number desired, and contemplated numbers of tips include about 100 tips to about 15 million tips, or greater. The number of tips of the tip array can be greater than about 1 million, greater than about 2 million, greater than about 3 million, greater than about 4 million, greater than 5 million tips, greater than 6 million, greater than 7 million, greater than 8 million, greater than 9 million, greater than 10 million, greater than 11 million, greater than 12 million, greater than 13 million, greater than 14 million, or greater than 15 million tips.

The tip array comprising tips and backing layer can have any suitable thickness, for example in a range of about 50 μm to about 5 mm, about 50 μm to about 100 μm, or about 1 mm to about 5 mm. For example, the tip array can have a minimum thickness of about 50, 100, 200, 300, 400, 500, 600, 700, 800, 900, 1000, 2000, 3000, 4000, or 5000 μm. For example, the backing layer can have a maximum thickness of about 50, 100, 200, 300, 400, 500, 600, 700, 800, 900, 1000, 2000, 3000, 4000, or 5000 μm.

The tip array can be attached to a rigid support. The rigid support, when present, is disposed opposite the tips of the tip array and parallel to the backing layer. In some cases, the rigid support is at least translucent, or is substantially transparent. In some cases, the backing layer and rigid support together are at least translucent or are substantially transparent. Non-limiting examples of rigid supports include formed from glass, silicon, quartz, ceramic, polymer, or any combination thereof. The rigid support is preferably highly rigid and has a highly planar surface upon which to mount the tip array. The combined thickness of the tip array and optional rigid support can be of any desired thickness, for example in range of about 50 μm to about 5 μm. The combined thickness can be less than about 5 mm, less than 1 mm, less than about 750 or less than about 500 μm, for example.

The tip arrays are non-cantilevered and comprise tips (e.g. silicon or silicon-containing) which can be designed to have any shape or spacing (pitch) between them, as needed. The shape of each tip can be the same or different from other tips of the array, and preferably the tips have a common shape. Contemplated tip shapes include spheroid, hemispheroid, toroid, polyhedron, cone, cylinder, and pyramid (e.g., trigonal or square or octagonal). The tips can be arranged randomly or preferably in a regular periodic pattern (e.g., in columns and rows, in a circular pattern, or the like).

The tips have a base portion fixed to the backing layer. The base portion preferably is larger than the tip end portion. The base portion of the tips can have diameter of any suitable dimension, for example in a range of about 1 μm to about 50 μm, or about 5 μm to about 50 μm, or less than 100 μm, or less than 50 μm. For example, the minimum diameter of the base of the tips can be about 1, 2, 3, 4, 5, 6, 7, 8, 9, 10, 11, 12, 13, 14, 15, 16, 17, 18, 19, 20 22, 24, 26, 28, 30, 32, 34, 36, 38, 40, 42, 44, 46, 48, or 50 μm. For example, the maximum diameter of the base of the tips can be about 1, 2, 3, 4, 5, 6, 7, 8, 9, 10, 11, 12, 13, 14, 15, 16, 17, 18, 19, 20, 22, 24, 26, 28, 30, 32, 34, 36, 38, 40, 42, 44, 46, 48, or 50 μm.

A preferred shape of the tips is pyramidal, more preferably octagonal pyramidal. The substrate-contacting (tip end) portions of the tips each can have a radius of curvature of any suitable dimension, for example in a range of about 5 nm to about 1 μm. For example, the minimum radius of curvature can be about 5, 10, 15, 20, 21, 22, 23, 24, 25, 26, 27, 28, 29, 30, 35, 40, 45, 50, 55, 60, 65, 70, 75, 80, 85, 90, 95, 100, 150, 200, 250, 300, 350, 400, 450, 500, 550, 600, 650, 700, 750, 800, 850, 900, 950, or 1000 nm. The substrate-contacting portions of the tips are preferably sharp, so that each is suitable for forming submicron patterns, e.g., a radius of curvature of less than about 500 nm, less than 100 nm, less than 50 nm, or less than 25 nm.

The tip-to-tip spacing between adjacent tips (tip pitch) can be of any desired dimension, for example in a range of about 1 µm to about over 10 mm, or about 20 µm to about 1 mm. For example, the minimum tip-to-tip spacing can be about 1 µm, 2 µm, 3 µm, 4 µm, 5 µm, 6 µm, 7 µm, 8 µm, 9 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, 200 µm, 300 µm, 400 µm, 500 µm, 600 µm, 700 µm, 800 µm, 900 µm, 1 mm, 2 mm, 3 mm, 4 mm, 5 mm, 6 mm, 7 mm, 8 mm, 9 mm, or 10 mm. For example, the maximum tip-to-tip spacing can be about 1 µm, 2 µm, 3 µm, 4 µm, 5 µm, 6 µm, 7 µm, 8 µm, 9 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, 200 µm, 300 µm, 400 µm, 500 µm, 600 µm, 700 µm, 800 µm, 900 µm, 1 mm, 2 mm, 3 mm, 4 mm, 5 mm, 6 mm, 7 mm, 8 mm, 9 mm, or 10 mm.

The tips of the tip array can be designed to have any desired height, and preferably the height of the tips is in a range of about 50 nm to less than 100 µm, about 50 nm to about 90 µm, about 50 nm to about 80 µm, about 50 nm to about 70 µm, about 50 nm to about 60 µm, about 10 µm to about 50 µm, about 50 nm to about 40 µm, about 50 nm to about 30 µm, about 50 nm to about 20 µm, about 50 nm to about 500 nm, about 50 nm to about 400 nm, about 50 nm to about 300 nm, about 50 nm to about 200 nm, or about 50 nm to about 100 nm. For example, the minimum height can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 µm, 5 µm, 10 µm, 15 µm, 20 µm, 25 µm, 30 µm, 35 µm, 40 µm, 45 µm, or 50 µm. For example, the maximum height can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 µm, 5 µm, 10 µm, 15 µm, 20 µm, 25 µm, 30 µm, 35 µm, 40 µm, 45 µm, or 100 µm.

The tip array can optionally include an adhesion-enhancing layer between the tips and the backing layer. This layer can increase the stability of the tip-backing layer adhesion and/or increase the facility with which the tips and backing layer are adhered. The adhesion-enhancing layer can be disposed over the entire elastomeric backing layer, or optionally only in selected regions (e.g. between each tip and the elastomeric backing layer). One non-limiting example of an adhesion-enhancing layer is a silicon dioxide layer. Other examples include epoxy resins or other adhesive materials.

The tip array can optionally include a coating disposed on the exposed surfaces of the tips and further optionally also over the surfaces of the backing layer adjacent to the tips. This coating can comprise a conductive material (e.g., a material capable of conducting electrical energy), for example. Non-limiting examples of a conductive coating include gold, silver, titanium, nickel, copper, conductive metals, conductive metal alloys, or combinations thereof.

Patterning Methods

MPH-SPN can be performed using any suitable platform capable of having a tip array as disclosed herein mounted, for example, a Park AFM platform (XEP, Park Systems Co., Suwon, Korea).

A tip array as disclosed herein can be brought into contact with a substrate surface, whereby all or substantially all of the tips of the tip array are in contact with the substrate surface. The contacting of the tips to the substrate surface can be used to form a pattern on the substrate surface. These patterns can be formed by any suitable process, for example one or more of depositing a patterning composition (e.g., an ink), indenting the surface, puncturing the surface, cutting the surface, etching the surface, oxidizing the surface, desorbing a material from the surface, or combinations thereof.

When an ink is deposited, the method optionally further includes coating the tips of the tip array with a patterning composition (e.g., ink) prior to the contacting step. In some cases, the patterning composition comprises an etchant or component which etches the substrate surface and/or an oxidant or component which oxidizes the substrate surface. The contacting time for the tips can be any suitable time, for example in a range of about 0.001 s to about 60 s, depending upon the amount of patterning composition desired in any specific point on a substrate surface.

Patterning by indenting, puncturing, and/or cutting the surface can occur in embodiments wherein the substrate comprises a compressible or soft material, capable of being indented, punctured, or cut by the silicon tips of the disclosed tip arrays. The indentations formed can be about 5 nm to about 1000 µm deep, for example. In practical terms, maximum size of the indentations will depend on the substrate thickness and/or the tip dimensions.

Patterning by desorbing a material from the surface can occur by applying a voltage across a tip array that has been further modified to include a conductive coating layer. The electrical energy can transfer from the conductive material-coated tip to the substrate surface, either by direct contact or when the tip and substrate surface are sufficiently close such that the electrical energy can transfer to the surface. A suitable material on the substrate surface can then be desorbed from the surface upon transfer of the electrical energy. Non-limiting examples of a material that can be desorbed upon application of electrical energy is 16-mercaptohexadecanoic acid (MHA) or octadecanethiol (ODT). Other non-limiting examples include alkane thiols (which can be, e.g., absorbed onto a gold substrate surface) and phosphonic acids (which can be, e.g., absorbed onto a silicon dioxide surface). In some cases, a material is desorbed from the substrate surface and the exposed surface is then modified, e.g., etched, patterned as disclosed herein, oxidized, or the like, in a separate step. In a specific example, the exposed surface is then etched with electrical energy.

The substrate surface can be contacted with a tip array a plurality of times, wherein the tip array, the substrate surface or both move laterally with respect to each other to allow for different portions of the substrate surface to be contacted. The time of each contacting step can be the same or different, depending upon the desired pattern. The shape of the indicia or patterns has no practical limitation, and can include dots, lines (e.g., straight or curved, formed from individual dots or continuously), a preselected pattern, or any combination thereof.

The indicia resulting from the disclosed methods have a high degree of sameness, and thus are uniform or substantially uniform in size, and preferably also in shape. The individual indicia feature size (e.g., a dot or line width) is highly uniform, for example within a tolerance of about 5%, or about 1%, or about 0.5%. The tolerance can be about 0.9%, about 0.8%, about 0.7%, about 0.6%, about 0.4%, about 0.3%, about 0.2%, or about 0.1%. Non-uniformity of feature size and/or shape can lead to roughness of indicia that can be undesirable for sub-micron type patterning.

The feature size can be about 10 nm to about 1 mm, about 10 nm to about 500 µm, about 10 nm to about 100 µm, about 50 nm to about 100 µm, about 50 nm to about 50 µm, about 50 nm to about 10 µm, about 50 nm to about 5 µm, or about 50 nm to about 1 µm. Features sizes can be less than 1 µm, less than about 900 nm, less than about 800 nm, less than about 700 nm, less than about 600 nm, less than about 500 nm, less than about 400 nm, less than about 300 nm, less than about 200 nm, less than about 100 nm, less than about 90 nm, less than about 80 nm, less than about 70 nm, less than about 60 nm, or less than about 50 nm.

The backing layer of the tip array can comprise an at least translucent material. The methods disclosed herein can further comprise illuminating the tip array with incident light, and upon contact of a tip to the substrate surface, there is a change in reflection of the incident light in the backing layer above all or substantially all of the tips, wherein the change in the reflection of light is indicative of contact between the tip and the substrate surface. The light reflects from the back of the tip and/or in the backing layer near the vicinity of the tip, and upon contact of the tip with the substrate surface, there is a change in the light reflection from the back of the tip and/or the backing layer. This change in reflection can be used to optically monitor leveling of the tip array on the substrate surface. Thus, leveling of the tip array can be performed in the absence of laser feedback, which DPN tip arrays typically need in assisting monitoring of the leveling of their tip arrays.

Given the large number of tips of the tip arrays disclosed and their small size, as a practical matter it may be difficult or impossible to know definitively if all of the tips are in contact with the surface. For example, a defect in a tip or the substrate surface, or an irregularity in a substrate surface, may result in a single tip not making contact while all other tips are in uniform contact. Thus, the disclosed methods provide for at least substantially all of the tips to be in contact with the substrate surface (e.g., to the extent detectable or within the bounds of material and fabrication tolerances). For example, at least 90%, at least 95%, at least 96%, at least 97%, at least 98%, or at least 99% of the tips will be in contact with the substrate surface.

Patterning Compositions

Patterning compositions suitable for use in the disclosed methods include both homogeneous and heterogeneous compositions, the latter referring to a composition having more than one component. The patterning composition is coated on the tip array. The term "coating," as used herein when referring to the patterning composition, refers both to coating of the tip array as well adsorption and absorption by the tip array of the patterning composition. Upon coating of the tip array with the patterning composition, the patterning composition can be patterned on a substrate surface using the tip array.

Patterning compositions can be liquids, solids, semi-solids, and the like. Patterning compositions suitable for use include, but are not limited to, molecular solutions, polymer solutions, pastes, gels, creams, glues, resins, epoxies, adhesives, metal films, particulates, solders, etchants, and combinations thereof.

Patterning compositions can include materials such as, but not limited to, monolayer-forming species, thin film-forming species, oils, colloids, metals, metal complexes, metal oxides, ceramics, organic species (e.g., moieties comprising a carbon-carbon bond, such as small molecules, polymers, polymer precursors, proteins, antibodies, and the like), polymers (e.g., both non-biological polymers and biological polymers such as single and double stranded DNA, RNA, and the like), polymer precursors, dendrimers, nanoparticles, and combinations thereof. In some embodiments, one or more components of a patterning composition includes a functional group suitable for associating with a substrate, for example, by forming a chemical bond, by an ionic interaction, by a Van der Waals interaction, by an electrostatic interaction, by magnetism, by adhesion, and combinations thereof.

In some embodiments, the composition can be formulated to control its viscosity. Parameters that can control ink viscosity include, but are not limited to, solvent composition, solvent concentration, thickener composition, thickener concentration, particles size of a component, the molecular weight of a polymeric component, the degree of cross-linking of a polymeric component, the free volume (i.e., porosity) of a component, the swellability of a component, ionic interactions between ink components (e.g., solvent-thickener interactions), and combinations thereof.

In some embodiments, the patterning composition comprises an additive, such as a solvent, a thickening agent, an ionic species (e.g., a cation, an anion, a zwitterion, etc.), a carrier matrix (e.g., polyethylene glycol or agarose), the concentration of which can be selected to adjust one or more of the viscosity, the dielectric constant, the conductivity, the tonicity, the density, and the like.

Suitable thickening agents include, but are not limited to, metal salts of carboxyalkylcellulose derivatives (e.g., sodium carboxymethylcellulose), alkylcellulose derivatives (e.g., methylcellulose and ethylcellulose), partially oxidized alkylcellulose derivatives (e.g., hydroxyethylcellulose, hydroxypropylcellulose and hydroxypropylmethylcellulose), starches, polyacrylamide gels, homopolymers of poly-N-vinylpyrrolidone, poly(alkyl ethers) (e.g., polyethylene oxide, polyethylene glycol, and polypropylene oxide), agar, agarose, xanthan gums, gelatin, dendrimers, colloidal silicon dioxide, lipids (e.g., fats, oils, steroids, waxes, glycerides of fatty acids, such as oleic, linoleic, linolenic, and arachidonic acid, and lipid bilayers such as from phosphocholine) and combinations thereof. In some embodiments, a thickener is present in a concentration of about 0.5% to about 25%, about 1% to about 20%, or about 5% to about 15% by weight of a patterning composition.

Suitable solvents for a patterning composition include, but are not limited to, water, C1-C8 alcohols (e.g., methanol, ethanol, propanol and butanol), C6-C12 straight chain, branched and cyclic hydrocarbons (e.g., hexane and cyclohexane), C6-C14 aryl and aralkyl hydrocarbons (e.g., benzene and toluene), C3-C10 alkyl ketones (e.g., acetone), C3-C10 esters (e.g., ethyl acetate), C4-C10 alkyl ethers, and combinations thereof. In some embodiments, a solvent is present in a concentration of about 1% to about 99%, about 5% to about 95%, about 10% to about 90%, about 15% to about 95%, about 25% to about 95%, about 50% to about 95%, or about 75% to about 95% by weight of a patterning composition.

Patterning compositions can comprise an etchant. As used herein, an "etchant" refers to a component that can react with a surface to remove a portion of the surface. Thus, an etchant is used to form a subtractive feature by reacting with a surface and forming at least one of a volatile and/or soluble material that can be removed from the substrate, or a residue, particulate, or fragment that can be removed from the substrate by, for example, a rinsing or cleaning method. In some embodiments, an etchant is present in a concentration of about 0.5% to about 95%, about 1% to about 90%, about 2% to about 85%, about 0.5% to about 10%, or about 1% to about 10% by weight of the patterning composition.

Etchants suitable for use in the methods disclosed herein include, but are not limited to, an acidic etchant, a basic etchant, a fluoride-based etchant, and combinations thereof. Acidic etchants suitable for use with the present invention include, but are not limited to, sulfuric acid, trifluoromethanesulfonic acid, fluorosulfonic acid, trifluoroacetic acid, hydrofluoric acid, hydrochloric acid, carborane acid, and combinations thereof. Basic etchants suitable for use with the present invention include, but are not limited to, sodium hydroxide, potassium hydroxide, ammonium hydroxide, tetraalkylammonium hydroxide ammonia, ethanolamine, ethylenediamine, and combinations thereof. Fluoride-based etchants suitable for use with the present invention include, but are not limited to, ammonium fluoride, lithium fluoride, sodium fluoride, potassium fluoride, rubidium fluoride, cesium fluoride, francium fluoride, antimony fluoride, calcium fluoride, ammonium tetrafluoroborate, potassium tetrafluoroborate, and combinations thereof.

In some embodiments, the patterning composition includes a reactive component. As used herein, a "reactive component" refers to a compound or species that has a chemical interaction with a substrate. In some embodiments, a reactive component in the ink penetrates or diffuses into the substrate. In some embodiments, a reactive component transforms, binds, or promotes binding to exposed functional groups on the surface of the substrate. Reactive components can include, but are not limited to, ions, free radicals, metals, acids, bases, metal salts, organic reagents, and combinations thereof. Reactive components further include, without limitation, monolayer-forming species such as thiols, hydroxides, amines, silanols, siloxanes, and the like, and other monolayer-forming species known to a person or ordinary skill in the art. The reactive component can be present in a concentration of about 0.001% to about 100%, about 0.001% to about 50%, about 0.001% to about 25%, about 0.001% to about 10%, about 0.001% to about 5%, about 0.001% to about 2%, about 0.001% to about 1%, about 0.001% to about 0.5%, about 0.001% to about 0.05%, about 0.01% to about 10%, about 0.01% to about 5%, about 0.01% to about 2%, about 0.01% to about 1%, about 10% to about 100%, about 50% to about 99%, about 70% to about 95%, about 80% to about 99%, about 0.001%, about 0.005%, about 0.01%, about 0.1%, about 0.5%, about 1%, about 2%, or about 5% weight of the patterning composition.

The patterning composition can further comprise a conductive and/or semi-conductive component. As used herein, a "conductive component" refers to a compound or species that can transfer or move electrical charge. Conductive and semi-conductive components include, but are not limited to, a metal, a nanoparticle, a polymer, a cream solder, a resin, and combinations thereof. In some embodiments, a conductive component is present in a concentration of about 1% to about 100%, about 1% to about 10%, about 5% to about 100%, about 25% to about 100%, about 50% to about 100%, about 75% to about 99%, about 2%, about 5%, about 90%, about 95% by weight of the patterning composition.

Metals suitable for use in a patterning composition include, but are not limited to, a transition metal, aluminum, silicon, phosphorous, gallium, germanium, indium, tin, antimony, lead, bismuth, alloys thereof, and combinations thereof.

In some embodiments, the patterning composition comprises a semi-conductive polymer. Semi-conductive polymers suitable for use with the present invention include, but are not limited to, a polyaniline, a poly(3,4-ethylenedioxythiophene)-poly(styrenesulfonate), a polypyrrole, an arylene vinylene polymer, a polyphenylenevinylene, a polyacetylene, a polythiophene, a polyimidazole, and combinations thereof.

The patterning composition can include an insulating component. As used herein, an "insulating component" refers to a compound or species that is resistant to the movement or transfer of electrical charge. In some embodiments, an insulating component has a dielectric constant of about 1.5 to about 8 about 1.7 to about 5, about 1.8 to about 4, about 1.9 to about 3, about 2 to about 2.7, about 2.1 to about 2.5, about 8 to about 90, about 15 to about 85, about 20 to about 80, about 25 to about 75, or about 30 to about 70. Insulating components suitable for use in the methods disclosed herein include, but are not limited to, a polymer, a metal oxide, a metal carbide, a metal nitride, monomeric precursors thereof, particles thereof, and combinations thereof. Suitable polymers include, but are not limited to, a polydimethylsiloxane, a silsesquioxane, a polyethylene, a polypropylene, a polyimide, and combinations thereof. In some embodiments, for example, an insulating component is present in a concentration of about 1% to about 95%, about 1% to about 80%, about 1% to about 50%, about 1% to about 20%, about 1% to about 10%, about 20% to about 95%, about 20% to about 90%, about 40% to about 80%, about 1%, about 5%, about 10%, about 90%, or about 95% by weight of the patterning composition.

The patterning composition can include a masking component. As used herein, a "masking component" refers to a compound or species that upon reacting forms a surface feature resistant to a species capable of reacting with the surrounding surface. Masking components suitable for use with the present invention include materials commonly employed in traditional photolithography methods as "resists" (e.g., photoresists, chemical resists, self-assembled monolayers, etc.). Masking components suitable for use in the disclosed methods include, but are not limited to, a polymer such as a polyvinylpyrollidone, poly(epichlorohydrin-co-ethyleneoxide), a polystyrene, a poly(styrene-co-butadiene), a poly(4-vinylpyridine-co-styrene), an amine terminated poly(styrene-co-butadiene), a poly(acrylonitrile-co-butadiene), a styrene-butadiene-styrene block copolymer, a styrene-ethylene-butylene block linear copolymer, a polystyrene-block-poly(ethylene-ran-butylene)-block-polystyrene, a poly(styrene-co-maleic anhydride), a polystyrene-block-poly(ethylene-ran-butylene)-block-polystyrene-graft-mal-eic anhydride, a polystyrene-block-polyisoprene-block-polystyrene, a polystyrene-block-poly(ethylene-ran-butylene)-block-polystyrene, a polynorbornene, a dicarboxy terminated poly(acrylonitrile-co-butadiene-co-acrylic acid), a dicarboxy terminated poly(acrylonitrile-co-butadiene), a polyethyleneimine, a poly(carbonate urethane), a poly(acrylonitrile-co-butadiene-co-styrene), a poly(vinylchloride), a poly(acrylic acid), a poly(methylmethacrylate), a poly(methyl methacrylate-co-methacrylic acid), a polyisoprene, a poly(1,4-butylene terephthalate), a polypropylene, a poly(vinyl alcohol), a poly(1,4-phenylene sulfide), a polylimonene, a poly(vinylalcohol-co-ethylene), a poly[N,N'-(1,3-phenylene)isophthalamide], a poly(1,4-phenylene ether-ether-sulfone), a poly(ethyleneoxide), a poly[butylene terephthalate-co-poly(alkylene glycol) terephthalate], a poly(ethylene glycol) diacrylate, a poly(4-vinylpyridine), a poly(DL-lactide), a poly(3,3',4,4'-benzophenonetetracarboxylic dianhydride-co-4,4'-oxydianiline/1,3-phenylenediamine), an agarose, a polyvinylidene fluoride homopolymer, a styrene butadiene copolymer, a phenolic resin, a ketone resin, a 4,5-difluoro-2,2-bis(trifluoromethyl)-1,3-dioxane, a salt thereof, and combinations thereof. In some embodiments, a masking component is present in a concentration of about 1% to about 10%, about 1% to about 5%, or about 2% by weight of the patterning composition.

The patterning composition can include a conductive component and a reactive component. For example, a reactive component can promote at least one of: penetration of a conductive component into a surface, reaction between the conductive component and a surface, adhesion between a conductive feature and a surface, promoting electrical contact between a conductive feature and a surface, and combinations thereof. Surface features formed by reacting this patterning composition include conductive features selected from the group consisting of: additive non-penetrating, additive penetrating, subtractive penetrating, and conformal penetrating surface features.

The patterning composition can comprise an etchant and a conductive component, for example, suitable for producing a subtractive surface feature having a conductive feature inset therein.

The patterning composition can comprise an insulating component and a reactive component. For example, a reactive component can promote at least one of: penetration of an insulating component into a surface, reaction between the insulating component and a surface, adhesion between an insulating feature and a surface, promoting electrical contact between an insulating feature and a surface, and combinations thereof. Surface features formed by reacting this patterning composition include insulating features selected from the group consisting of: additive non-penetrating, additive penetrating, subtractive penetrating, and conformal penetrating surface features.

The patterning composition can comprise an etchant and an insulating component, for example, suitable for producing a subtractive surface feature having an insulating feature inset therein.

The patterning composition can comprise a conductive component and a masking component, for example, suitable for producing electrically conductive masking features on a surface.

Other contemplated components of a patterning composition suitable for use with the disclosed methods include thiols, 1,9-nonanedithiol solution, silane, silazanes, alkynes cystamine, N-Fmoc protected amino thiols, biomolecules, DNA, proteins, antibodies, collagen, peptides, biotin, and carbon nanotubes.

For a description of patterning compounds and patterning compositions, and their preparation and use, see Xia and Whitesides, Angew. Chem. Int. Ed., 37, 550-575 (1998) and references cited therein; Bishop et al., Curr. Opinion Colloid & Interface Sci., 1, 127-136 (1996); Calvert, J. Vac. Sci. Technol. B, 11, 2155-2163 (1993); Ulman, Chem. Rev., 96:1533 (1996) (alkanethiols on gold); Dubois et al., Annu. Rev. Phys. Chem., 43:437 (1992) (alkanethiols on gold); Ulman, An Introduction to Ultrathin Organic Films: From Langmuir-Blodgett to Self-Assembly (Academic, Boston, 1991) (alkanethiols on gold); Whitesides, Proceedings of the Robert A. Welch Foundation 39th Conference On Chemical Research Nanophase Chemistry, Houston, Tex., pages 109-121 (1995) (alkanethiols attached to gold); Mucic et al. Chem. Commun. 555-557 (1996) (describes a method of attaching 3' thiol DNA to gold surfaces); U.S. Pat. No. 5,472,881 (binding of oligonucleotide-phosphorothiolates to gold surfaces); Burwell, Chemical Technology, 4, 370-377 (1974) and Matteucci and Caruthers, J. Am. Chem. Soc., 103, 3185-3191 (1981) (binding of oligonucleotides-alkylsiloxanes to silica and glass surfaces); Grabar et al., Anal. Chem., 67, 735-743 (binding of aminoalkylsiloxanes and for similar binding of mercaptoalkylsiloxanes); Nuzzo et al., J. Am. Chem. Soc., 109, 2358 (1987) (disulfides on gold); Allara and Nuzzo, Langmuir, 1, 45 (1985) (carboxylic acids on aluminum); Allara and Tompkins, J. Colloid Interfate Sci., 49, 410-421 (1974) (carboxylic acids on copper); Iler, The Chemistry Of Silica, Chapter 6, (Wiley 1979) (carboxylic acids on silica); Timmons and Zisman, J. Phys. Chem., 69, 984-990 (1965) (carboxylic acids on platinum); Soriaga and Hubbard, J. Am. Chem. Soc., 104, 3937 (1982) (aromatic ring compounds on platinum); Hubbard, Acc. Chem. Res., 13, 177 (1980) (sulfolanes, sulfoxides and other functionalized solvents on platinum); Hickman et al., J. Am. Chem. Soc., 111, 7271 (1989) (isonitriles on platinum); Maoz and Sagiv, Langmuir, 3, 1045 (1987) (silanes on silica); Maoz and Sagiv, Langmuir, 3, 1034 (1987) (silanes on silica); Wasserman et al., Langmuir, 5, 1074 (1989) (silanes on silica); Eltekova and Eltekov, Langmuir, 3,951 (1987) (aromatic carboxylic acids, aldehydes, alcohols and methoxy groups on titanium dioxide and silica); and Lec et al., J. Phys. Chem., 92, 2597 (1988) (rigid phosphates on metals); Lo et al., J. Am. Chem. Soc., 118, 11295-11296 (1996) (attachment of pyrroles to superconductors); Chen et al., J. Am. Chem. Soc., 117, 6374-5 (1995) (attachment of amines and thiols to superconductors); Chen et al., Langmuir, 12, 2622-2624 (1996) (attachment of thiols to superconductors); McDevitt et al., U.S. Pat. No. 5,846,909 (attachment of amines and thiols to superconductors); Xu et al., Langmuir, 14, 6505-6511 (1998) (attachment of amines to superconductors); Mirkin et al., Adv. Mater. (Weinheim, Ger.), 9, 167-173 (1997) (attachment of amines to superconductors); Hovis et al., J. Phys. Chem. B, 102, 6873-6879 (1998) (attachment of olefins and dienes to silicon); Hovis et al., Surf. Sci., 402-404, 1-7 (1998) (attachment of olefins and dienes to silicon); Hovis et al., J. Phys. Chem. B, 101, 9581-9585 (1997) (attachment of olefins and dienes to silicon); Hamers et al., J. Phys. Chem. B, 101, 1489-1492 (1997) (attachment of olefins and dienes to silicon); Hamers et al., U.S. Pat. No. 5,908,692 (attachment of olefins and dienes to silicon); Ellison et al., J. Phys. Chem. B, 103, 6243-6251 (1999) (attachment of isothiocyanates to silicon); Ellison et al., J. Phys. Chem. B, 102, 8510-8518 (1998) (attachment of azoalkanes to silicon); Ohno et al., Mol. Cryst. Liq. Cryst. Sci. Technol., Sect. A, 295, 487-490 (1997) (attachment of thiols to GaAs); Reuter et al., Mater. Res. Soc. Symp. Proc., 380, 119-24 (1995) (attachment of thiols to GaAs); Bain, Adv. Mater. (Weinheim, Fed. Repub. Ger.), 4, 591-4 (1992) (attachment of thiols to GaAs); Sheen et al., J. Am. Chem. Soc., 114, 1514-15 (1992) (attachment of thiols to GaAs); Nakagawa et al., Jpn. J. Appl. Phys., Part 1, 30, 3759-62 (1991) (attachment of thiols to GaAs); Lunt et al., J. Appl. Phys., 70, 7449-67 (1991) (attachment of thiols to GaAs); Lunt et al., J. Vac. Sci. Technol., B, 9, 2333-6 (1991) (attachment ofthiols to GaAs); Yamamoto et al., Langmuir ACS ASAP, web release number Ia990467r (attachment of thiols to InP); Gu et al., J. Phys. Chem. B, 102, 9015-9028 (1998) (attachment of thiols to InP); Menzel et al., Adv. Mater. (Weinheim, Ger.), 11, 131-134 (1999) (attachment of disulfides to gold); Yonezawa et al., Chem. Mater., 11, 33-35 (1999) (attachment of disulfides to gold); Porter et al., Langmuir, 14, 7378-7386 (1998) (attachment of disulfides to gold); Son et al., J. Phys. Chem., 98, 8488-93 (1994) (attachment of nitriles to gold and silver); Steiner et al., Langmuir, 8, 2771-7 (1992) (attachment of nitriles to gold and copper); Solomun et al., J. Phys. Chem., 95, 10041-9 (1991) (attachment of nitriles to gold); Solomun et al., Ber. Bunsen-Ges. Phys. Chem., 95, 95-8 (1991) (attachment of nitriles to gold); Henderson et al., Inorg. Chim. Acta, 242, 115-24 (1996) (attachment of isonitriles to gold); Huc et al., J. Phys. Chem. B, 103, 10489-10495 (1999) (attachment of isonitriles to gold); Hickman et al., Langmuir, 8, 357-9 (1992) (attachment of isonitriles to platinum); Steiner et al., Langmuir, 8, 90-4 (1992) (attachment of amines and phospines to gold and attachment of amines to copper); Mayya et al., J. Phys. Chem. B, 101, 9790-9793 (1997) (attachment of amines to gold and silver); Chen et al., Langmuir, 15, 1075-1082 (1999) (attachment of carboxylates to gold); Tao, J. Am. Chem. Soc., 115, 4350-4358 (1993) (attachment of carboxylates to copper and silver); Laibinis et al., J. Am. Chem. Soc., 114, 1990-5 (1992) (attachment of thiols to silver and copper); Laibinis et al., Langmuir, 7, 3167-73 (1991) (attachment of thiols to silver); Fenter et al., Langmuir, 7, 2013-16 (1991) (attachment of thiols to silver); Chang et al., Am. Chem. Soc., 116, 6792-805 (1994) (attachment of thiols to silver); Li et al., J. Phys. Chem., 98, 11751-5 (1994) (attachment of thiols to silver); Li et al., Report, 24 pp (1994) (attachment of thiols to silver); Tarlov et al., U.S. Pat. No. 5,942,397 (attachment of thiols to silver and copper); Waldeck, et al., PCT application WO/99/48682 (attachment of thiols to silver and copper); Gui et al., Langmuir, 7, 955-63 (1991) (attachment of thiols to silver); Walczak et al., J. Am. Chem. Soc., 113, 2370-8 (1991) (attachment of thiols to silver); Sangiorgi et al., Gazz. Chim. Ital., 111, 99-102 (1981) (attachment of amines to copper); Magallon et al., Book of Abstracts, 215th ACS National Meeting, Dallas, Mar. 29-Apr. 2, 1998, COLL-048 (attachment of amines to copper); Patil et al., Langmuir, 14, 2707-2711 (1998) (attachment of amines to silver); Sastry et al., J. Phys. Chem. B, 101, 4954-4958 (1997) (attachment of amines to silver); Bansal et al., J. Phys. Chem. B. 102, 4058-4060 (1998) (attachment of alkyl lithium to silicon); Bansal et al., J. Phys. Chem. B, 102, 1067-1070 (1998) (attachment of alkyl lithium to silicon); Chidsey, Book of Abstracts, 214th ACS National Meeting, Las Vegas, Nev., Sep. 7-11, 1997, I&EC-027 (attachment of alkyl lithium to silicon); Song, J. H., Thesis, University of California at San Diego (1998) (attachment of alkyl lithium to silicon dioxide); Meyer et al., J. Am. Chem. Soc., 110, 4914-18 (1988) (attachment of amines to semiconductors); Brazdil et al. J. Phys. Chem., 85, 1005-14 (1981) (attachment of amines to semiconductors); James et al., Langmuir, 14, 741-744 (1998) (attachment of proteins and peptides to glass); Bernard et al., Langmuir, 14, 2225-2229 (1998) (attachment of proteins to glass, polystyrene, gold, silver and silicon wafers); Pereira et al., J. Mater. Chem., 10, 259 (2000) (attachment of silazanes to $SiO_2$); Pereira et al., J. Mater. Chem., 10, 259 (2000) (attachment of silazanes to $SiO_2$); Dammel, Diazonaphthoquinone Based Resists (1st ed., SPIE Optical Engineering Press, Bellingham, Wash., 1993) (attachment of silazanes to $SiO_2$); Anwander et al., J. Phys. Chem. B, 104, 3532 (2000) (attachment of silazanes to $SiO_2$); Slavov et al., J. Phys. Chem., 104, 983 (2000) (attachment of silazanes to $SiO_2$).

Substrates to be Patterned

Substrates suitable for use in methods disclosed herein include, but are not limited to, metals, alloys, composites, crystalline materials, amorphous materials, conductors, semiconductors, optics, fibers, inorganic materials, glasses, ceramics (e.g., metal oxides, metal nitrides, metal silicides, and combinations thereof), zeolites, polymers, plastics, organic materials, minerals, biomaterials, living tissue, bone, films thereof, thin films thereof, laminates thereof, foils thereof, composites thereof, and combinations thereof. A substrate can comprise a semiconductor such as, but not limited to: crystalline silicon, polycrystalline silicon, amorphous silicon, p-doped silicon, n-doped silicon, silicon oxide, silicon germanium, germanium, gallium arsenide, gallium arsenide phosphide, indium tin oxide, and combinations thereof. A substrate can comprise a glass such as, but not limited to, undoped silica glass ($SiO_2$), fluorinated silica glass, borosilicate glass, borophosphorosilicate glass, organosilicate glass, porous organosilicate glass, and combinations thereof. The substrate can be a non-planar substrate, such as pyrolytic carbon, reinforced carbon-carbon composite, a carbon phenolic resin, and the like, and combinations thereof. A substrate can comprise a ceramic such as, but not limited to, silicon carbide, hydrogenated silicon carbide, silicon nitride, silicon carbonitride, silicon oxynitride, silicon oxycarbide, high-temperature reusable surface insulation, fibrous refractory composite insulation tiles, toughened unipiece fibrous insulation, low-temperature reusable surface insulation, advanced reusable surface insulation, and combinations thereof. A substrate can comprise a flexible material, such as, but not limited to: a plastic, a metal, a composite thereof, a laminate thereof, a thin film thereof, a foil thereof, and combinations thereof.

In some cases, the substrate comprises a compressible material. The compressible material can be layered on top of a substrate as described herein. Examples of compressible materials include, but are not limited to, polymers, metals (e.g., soft metals), foils, films, or the like. Non-limiting examples of a compressible layer include polymethylmethacrylate (PMMA), polydimethylsiloxane (PDMS), nitrocellulose, and combinations thereof.

In some cases, the substrate comprises a material that can be desorbed upon application of electrical energy. Non-limiting examples of such a material include 16-mercaptohexadecanoic acid (MHA) and octadecanethiol (ODT), alkane thiols, and phosphonic acids.

EXAMPLES

Fabrication of Si Etching Masks

The thickness of 50±5 µm Si wafers (NOVA Electronic Materials Ltd., TX, resistivity 1-10 Ωcm, (100) orientation) with 10,000 Å±5% of thick $SiO_2$ layer was used for fabricating pen arrays. The wafer was cleaned in acetone, ethanol, and rinsed in water. Care was taken because 50 µm thick Si is extremely fragile. In preparing PDMS, PDMS base and curing agent (SYLGARD 184 Silicone) were mixed in 20:1 ratio by weight, and degassed under vacuum. Oxygen plasma-treated wafers were then placed on uncured PDMS on cleaned glass slides, followed by curing at 70° C. for 24 h. The resulting wafer/PDMS/glass slide sample was easier to handle in comparison with the 50 µm thick wafer.

The choice of a particular mask material depends on a number of considerations. The main issues are availability of materials, ease of the process (processing time, complexity of the process, and reliability), and/or selectivity of the etch process. Metals such as gold, chromium, platinum, silver, copper, and titanium are known to be resistant against KOH. It was found that KOH could etch thermally evaporated Au/Ti. Indeed, the use of Au (500 nm)/Ti (100 nm) mask in KOH etching for 1 hour at 75° C. resulted in a significant failure in fabricating tips due to pinholes in the mask. Thermally grown $SiO_2$ was found to be a suitable mask material as it has a greater etch selectivity of Si:$SiO_2$ than metal materials on the order of 500:1. Si wafers with a thickness of 50±5 µm were thermally oxidized (NOVA Electronic Materials Ltd., TX) to give a 10,000 Å±5% of thick $SiO_2$ layer, and no wafer curvature was observed. Since etching rate of Si (100) in 40 wt % KOH at 75° C. is 50 µm/h, the minimum required thickness of $SiO_2$ was 250 nm. For etch mask fabrication, the square mask along the <110> direction was transferred into the $SiO_2$ layer by photolithography with photoresist (AZ 1518, MicroChem, Inc.) and isotropic buffered HF (Transene, Inc.) etch for 9 min. To remove the photoresist, the wafer was cleaned in acetone, then ethanol and dried with nitrogen. The wafer was then finally cleaned in an oxygen plasma. These cleaning procedures prior to Si etching were found to improve the uniformity of the tip formation and reduce micro-masking.

Fabrication of Si Tip Arrays

The wafer was etched for 1 min using unbuffered HF (Time Etch, Transene, Inc.) to remove the native oxide from the surface of the Si regions, rinsed in water and dried in nitrogen.

The sample was immediately transferred to 40 wt % KOH solution at 75° C. and held in the center of the etchant in a Teflon holder. The solution was continuously stirred to reduce the effect of micro-masking by hydrogen bubbles generated in the reaction at the Si surface. After 60-65 min, the sample was removed from the etchant, rinsed in water and dried using nitrogen. The use of a bottom $SiO_2$ layer contacting PDMS significantly increases the adhesion of tips to PDMS during etching. For example, a number of tips fell off from the PDMS surface during etching when no interfacial $SiO_2$ layer was employed (FIG. 5). Direct exposure of PDMS to a KOH solution at relatively high temperature seems to cause swelling of PDMS that may stress the interface between PDMS and Si tips and facilitate tip separation, although PDMS is known to be compatible with KOH solution at room-temperature for 24 hours (swelling ratio about 1.00±0.01). With the particular wafer used in this experiment, the tip height may vary up to 10% in optimized conditions, since the wafer itself has a variation of 10% in thickness (50±5 μm).

Fabrication of Nanopatterns by Material and Energy Delivery

SPN was performed with a Park System nanolithography platform (Park System, Inc., Korea) equipped with an environmental chamber (an active humidity control) driven by commercially available PPL software (Park System, Inc., Korea) with feedback turned off and a relative humidity of 15-50% and temperature of about 25° C. To pattern MHA on Au surface, MHA (5-10 mM) was spin-coated (1 mL, 1000 rpm, 30 s) in oxygen-plasma cleaned Si pen array (1 min). The inked Si pen array was used for generating MHA dot patterns on a thermally evaporated polycrystalline Au surface (25 nm Au with a 5 nm Ti adhesion layer coated on Si) by bringing it in contact with the Au surface. The exposed Au on this MHA patterned surface was subsequently etched (20 mM thiourea, 30 mM iron nitrate, 20 mM hydrochloric acid, and 2 mM octanol in water) to yield raised structures that are approximately 25 nm in height and easily imaged by SEM.

To mechanically pattern nano-holes, PMMA (495 PMMA C3, MicroChem, Inc.) diluted in chlorobenzene (1 g PMMA: 2.5 g chlorobenzene) was spin-coated onto Si substrate at 3,000 rpm for 45 s, and thermally annealed at 180° C. for 1 min. The typical thickness of the film was about 30 nm. Patterns were generated by indentation of the Si pen in the film at room temperature by controlling the position of z-piezo scanner.

To electrically pattern nano-holes, the Si pen array was first deposited with Au (50 nm)/Ti (5 nm) to be conductive. SAMs of MHA molecules were prepared on Au thin films by immersing a substrate in a 1 mM MHA ethanol solution for 1 h, followed by rinsing with ethanol and water, and drying with $N_2$. A Si pen array with bias voltage of −10 V contacted the MHA SAM surface to selectively desorb portions of the MHA SAM surface under ambient conditions (about 30% humidity, 23° C.).

AFM topographical and lateral force microscopy (LFM) images were recorded on a VEECO BIOSCOPE equipped with a Nanoscope IIIA controller and SEM images were taken using a HITACHI S-4800 (HITACHI High Technologies).

The foregoing describes and exemplifies the invention but is not intended to limit the invention defined by the claims which follow. All of the methods disclosed and claimed herein can be made and executed without undue experimentation in light of the present disclosure. While the materials and methods of this invention have been described in terms of specific embodiments, it will be apparent to those of skill in the art that variations may be applied to the materials and/or methods and in the steps or in the sequence of steps of the methods described herein without departing from the concept, spirit and scope of the invention. More specifically, it will be apparent that certain agents which are both chemically and physiologically related may be substituted for the agents described herein while the same or similar results would be achieved.

Throughout this specification and the claims which follow, unless the context requires otherwise, the word "comprise" and variations such as "comprises" and "comprising" will be understood to imply the inclusion of a stated integer or step or group of integers or steps but not the exclusion of any other integer or step or group of integers or steps.

Throughout the specification, where compositions are described as including components or materials, it is contemplated that the compositions can also consist essentially of, or consist of, any combination of the recited components or materials, unless described otherwise. The invention illustratively disclosed herein suitably may be practiced in the absence of any element or step which is not specifically disclosed herein.

The practice of a method disclosed herein, and individual steps thereof, can be performed manually and/or with the aid of or automation provided by electronic equipment. Although processes have been described with reference to particular embodiments, a person of ordinary skill in the art will readily appreciate that other ways of performing the acts associated with the methods may be used. For example, the order of various of the steps may be changed without departing from the scope or spirit of the method, unless described otherwise. In addition, it will be recognized that some of the individual steps may be combined, omitted, or further subdivided into additional steps.

All patents, publications and references cited herein are hereby fully incorporated by reference. In case of conflict between the present disclosure and incorporated patents, publications and references, the present disclosure should control.

What is claimed:

1. A tip array comprising a plurality of tips fixed to an elastomeric backing layer, the tips comprising a metal, a metalloid, a semi-conducting material, or a combination thereof, and each tip having a radius of curvature of less than 100 nm.

2. The tip array of claim 1, wherein the backing layer is at least translucent.

3. The tip array of claim 1, wherein the backing layer comprises an elastomeric polymer.

4. The tip array of claim 1, wherein the tips are pyramidal.

5. The tip array of claim 1, further comprising an adhesion-enhancing layer between the tips and the backing layer, optionally comprising silicon dioxide.

6. The tip array of claim 1, wherein the tips have a radius of curvature of less than 50 nm.

7. The tip array of claim 1, wherein the tips have a height of less than 100 μm.

8. The tip array of claim 1, wherein the tips and backing layer have a combined thickness of less than 1 mm.

9. The tip array of claim 1, further comprising a rigid support to which the backing layer is adhered, the rigid support disposed opposite the tips of the tip array and parallel to the backing layer.

10. The tip array of claim 1, further comprising a coating on the exposed surfaces of the tips and the surface of the backing layer adjacent to the tips.

11. The tip array of claim 1, wherein the tips comprise silicon, silicon nitride, gallium, gallium nitride, gallium sulfide, gallium arsenide, or a mixture thereof.

12. A method for sub-micron scale patterning of a substrate surface, comprising: contacting the substrate surface with all or substantially all of the tips of a tip array of claim 1 to form a pattern on the substrate surface, wherein the patterning comprises one or more processes selected from the group consisting of depositing ink, indenting the surface, puncturing the surface, cutting the surface, etching the surface, oxidizing the surface, desorbing a material from the surface, or combinations thereof.

13. The method of claim 12, further comprising selecting an at least translucent backing layer material for the tip array and illuminating the tip array with incident light, wherein contacting the substrate surface comprises bringing the tip array and substrate surface towards each other until there is a change in reflection of the incident light from the backing layer above all or substantially all of the tips, the change in reflected light being indicative of contact between tip and substrate surface.

14. The method of claim 13, wherein the contacting of the tip to the substrate surface is indicated in the absence of a laser feedback.

15. The method of claim 12, comprising contacting each tip of the tip array with the substrate surface.

16. The method of claim 12, further comprising coating exposed surfaces of the tips of the tips array with a patterning composition, and the contacting comprising depositing the patterning composition onto the substrate surface and forming a substantially uniform first set of indicia with all or substantially all of the coated tips.

17. The method of claim 12, wherein the tip array comprises a conductive coating, further comprising applying a voltage across the tip array to transmit electrical energy through the coated tip to the substrate surface to form indicia on the substrate surface at points of contact of the tip to the substrate surface.

18. The method of claim 12, wherein the patterning forms indicia or indentations having a feature size of less than 70 nm.

19. The method of claim 12, further comprising leveling the tips of the tip array with respect to the substrate surface by selecting an at least translucent material for the backing layer; backlighting the tip array with incident light to cause internal reflection of the incident light from the internal surfaces of the backing layer, from the back surfaces of the tips, or both; bringing the tips of the tip array and the substrate surface together along a z-axis up to a point of contact between a subset of the tips with the substrate surface, contact indicated by increased intensity of reflected light from the backing layer proximate to each of a subset of tips in contact with the substrate surface, whereas no change in the intensity of reflected light proximate to other tips indicates non-contacting tips; and tilting one or both of the tip array and the substrate surface with respect to the other in response to differences in intensity of the reflected light from the internal surfaces of the backing layer, to achieve contact between the substrate surface and non-contacting tips, wherein said tilting is performed one or more times along x-, y-, and/or z-axes.

20. A method of preparing a tip array according to claim 1, comprising
 (a) providing a silicon wafer;
 (b) adhering an elastomeric backing layer to the silicon wafer to form a structure;
 (c) forming a mask pattern over the silicon wafer to form pre-tip regions; and
 (d) etching the silicon pre-tip regions and silicon between pre-tip regions with an etching solution to form pyramidal silicon tips attached to the backing layer.

21. A tip array comprising a plurality of tips fixed to an elastomeric backing layer, the tips comprising a metal, a metalloid, a semi-conducting material, or a combination thereof, each tip having a radius of curvature of less than 1 µm, the tips comprising silicon, silicon nitride, gallium, gallium nitride, gallium sulfide, gallium arsenide, or a mixture thereof.

22. A tip array comprising a plurality of tips fixed to an elastomeric backing layer, the tips comprising a metal, a metalloid, a semi-conducting material, or a combination thereof, each tip having a radius of curvature of less than 1 µm, and the tips and backing layer have a combined thickness of less than 1 mm.

23. A tip array comprising a plurality of tips fixed to an elastomeric backing layer, the tips comprising a metal, a metalloid, a semi-conducting material, or a combination thereof, and a coating on the exposed surfaces of the tips and the surface of the backing layer adjacent to the tips, each tip having a radius of curvature of less than 1 µm.

* * * * *